(12) United States Patent
Dabiri

(10) Patent No.: US 8,331,508 B2
(45) Date of Patent: Dec. 11, 2012

(54) NARROWBAND INTERFERENCE CANCELLATION METHOD AND CIRCUIT

(75) Inventor: Dariush Dabiri, San Jose, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 192 days.

(21) Appl. No.: 12/952,150

(22) Filed: Nov. 22, 2010

(65) Prior Publication Data

US 2012/0014416 A1 Jan. 19, 2012

Related U.S. Application Data

(60) Provisional application No. 61/399,720, filed on Jul. 14, 2010.

(51) Int. Cl.
*H03D 1/04* (2006.01)
(52) U.S. Cl. ........ 375/346; 375/278; 375/284; 375/348; 375/350
(58) Field of Classification Search .............. 375/346, 375/278, 284, 348, 350
See application file for complete search history.

(56) References Cited

U.S. PATENT DOCUMENTS

| | | | |
|---|---|---|---|
| 6,904,443 B2 | 6/2005 | White | |
| 6,976,044 B1 | 12/2005 | Kilani | |
| 7,003,094 B2 | 2/2006 | Fisher et al. | |
| 7,741,921 B2 | 6/2010 | Ismailov | |
| 7,856,063 B2 * | 12/2010 | Coulson | 375/260 |
| 2003/0165205 A1 | 9/2003 | Chu et al. | |
| 2003/0179840 A1 * | 9/2003 | Oh et al. | 375/350 |
| 2003/0185147 A1 * | 10/2003 | Taga et al. | 370/210 |
| 2007/0009011 A1 | 1/2007 | Coulson | |
| 2008/0112525 A1 | 5/2008 | Do et al. | |
| 2008/0161035 A1 * | 7/2008 | Tomioka et al. | 455/550.1 |
| 2008/0267392 A1 | 10/2008 | Raheja et al. | |
| 2009/0061808 A1 | 3/2009 | Higgins | |
| 2009/0125793 A1 * | 5/2009 | Kishigami et al. | 714/794 |
| 2009/0238102 A1 | 9/2009 | Dabiri | |
| 2009/0252234 A1 | 10/2009 | Samdani et al. | |

OTHER PUBLICATIONS

U.S. Appl. No. 61/399,720, pp. 49.
U.S. Appl. No. 12/952,154, pp. 49.
U.S. Appl. No. 12/952,164, pp. 35.
U.S. Appl. No. 12/952,172, pp. 28.
U.S. Appl. No. 12/952,178, pp. 40.
U.S. Appl. No. 12/952,184, pp. 34.
U.S. Appl. No. 12/952,193, pp. 35.
Ungerboeck, G. "10GBASE-T Coding and Modulation: 128-DSQ+LPDC", IEEE P802.3an Task Force, Ottawa, Sep. 29-Oct. 1, 2004, pp. 15.

(Continued)

*Primary Examiner* — Kabir A Timory

(57) ABSTRACT

A narrowband interference (NBI) canceller is coupled to an A/D converter to receive an input signal and supply an NBI-canceled signal to an error correcting decoder. In the NBI canceller, a first arithmetic unit receives the input signal and a predicted-interference signal, and supplies a difference thereof as the interference-canceled signal. A slicer receives the interference-canceled signal and supplies a decision signal. A second arithmetic unit subtracts the decision signal from the input signal to generate a noise signal. A coarse frequency estimator receives the noise signal and analyzes the frequency spectrum to generate a coarse estimate of a fundamental frequency of the NBI. The coarse estimate is used by an adaptive narrowband interference predictor to generate the predicted-interference signal while adaptively tracking the narrowband interference. Use of the NBI canceller in a transceiver can eliminate link drop caused by operation of wireless devices that generate EMI in a cable.

16 Claims, 15 Drawing Sheets

OTHER PUBLICATIONS

"802.3an—2006 IEEE Standard for Information Technology—Telecommunications and Information Exchange Between Systems—Local and Metropolitan Area Networks—Specific Requirements, Part 3: Carrier Sense Multiple Access With Collision Detection (CSMA/CD) Access Method and Physical Layer Specifications", Sep. 2006, pp. 167.

Stolle, R. "Electromagnetic Coupling of Twisted Pair Cables", published in IEEE Journal on Selected Areas in Communications, vol. 20, No. 5, Jun. 2002, pp. 883-891.

Nehorai, A. et al., "Adaptive Comb Filtering for Harmonic Signal Enhancement", published in IEEE Transactions on Acoustics, Speech, and Signal Processing, vol. ASSP-34, No. 5, Oct. 1986, pp. 1124-1138.

Nehorai, A. "A Minimal Parameter Adaptive Notch Filter With Constrained Poles and Zeros", published in IEEE Transactions on Acoustics, Speech, and Signal Processing, vol. ASSP-33, No. 4, Aug. 1985, pp. 983-996.

Stoica, P. et al. "Performance Analysis of an Adaptive Notch Filter with Constrained Poles and Zeros", published in IEEE Transactions on Acoustics, Speech, and Signal Processing, vol. 36, No. 6, Jun. 1988, pp. 911-919.

MacLeod, M.D. "Fast Nearly ML Estimation of the Parameters of Real or Complex Single Tones or Resolved Multiple Tones", published in IEEE Transactions on Signal Processing, vol. 46, No. 1, Jan. 1998, pp. 141-148.

* cited by examiner

NARROWBAND INTERFERENCE CANCELLATION METHOD AND CIRCUIT

CROSS-REFERENCE TO PROVISIONAL APPLICATION

This application claims priority under 35 USC §119 (e) from a provisional application, namely U.S. Application No. 61/399,720 filed on Jul. 14, 2010 having the title "EMI cancellation method and apparatus", filed by Dariush Dabiri, which is incorporated by reference herein in its entirety.

CROSS-REFERENCE TO RELATED APPLICATIONS

This patent application is related to and incorporates by reference herein in their entirety, the following patent applications that are co-owned and concurrently filed herewith:

(1) U.S. patent application, entitled "Stabilized Digital Quadrature Oscillator" by Dariush Dabiri et al., Ser. No. 12/952,154;

(2) U.S. patent application, entitled "Detection and Estimation of Narrowband Interference By Matrix Multiplication" by Dariush Dabiri, Ser No. 12/952,164;

(3) U.S. patent application, entitled "Confirmation of Presence of Narrowband Interference By Harmonic Analysis" by Dariush Dabiri et al., Ser. No. 12/952,172;

(4) U.S. patent application, entitled "Adaptive Spectral Enhancement and Harmonic Separation" by Dariush Dabiri et al., Ser. No. 12/952,178;

(5) U.S. patent application, entitled "Adaptive Narrowband Interference Prediction Circuit and Method" by Dariush Dabiri et al., Ser. No. 12/952,184; and (6) U.S. patent application, entitled "Multi-Input IIR Filter with Error Feedback" by Maged F. Barsoum, et al., Ser. No. 12/952,193.

BACKGROUND

In a local area network, a PHY device 12 in a computer 10 (FIG. 1) may be connected to another PHY device 22 in an Ethernet Switch 20 by use of a cable 32. Cable 32 typically includes four twisted-pair copper conductors 32A-32D (which may be shielded or unshielded) that carry analog signals between four transceivers 12A-12D in PHY device 12 (that in turn is coupled to MAC device 11) and four transceivers 22A-22D in PHY device 22 (that in turn is coupled to MAC device 21). Each of transceivers 12A-12D typically includes a transmit data path and a receive data path in an integrated circuit (IC) die that forms PHY device 12. The transmit data path typically includes an FEC encoder, transmit circuitry, a digital to analog converter, an analog filter, and a line driver, illustrated unlabeled in FIG. 1. Similarly, the receive data path typically includes corresponding components in a reverse order, e.g. a receive amplifier, an analog filter, an analog to digital converter, receive circuitry and an FEC decoder (also see FIG. 1).

A signal received from cable 32 by any of transceivers 22A-22D is typically weak, and any degradation affects the bit error rate (BER). Degradation of the signal during transmission across cable 32 occurs for a number of known reasons, such as echo due to reflections in cable 32, near end cross talk (NEXT) and far end cross talk (FEXT) due to the adjacency of conductors in cable 32, attenuation caused by length of cable 32, etc. Such reasons for degradation are internal to a communication channel that is formed between transceivers 12A-12D, 22A-22D by cable 32. Such internally-originated noise depends strictly on the physical characteristics of cable 32 and its connections to transceivers 22A-22D. Several prior art techniques have been developed, to suppress or cancel such internally-originated noise.

The signal transmitted through cable 32 is occasionally further degraded by noise that originates externally ("externally-generated noise"). For example, coupling of electromagnetic energy radiated by a wireless device 31, such as a walkie-talkie typically occurs in cable 32, resulting in noise therein due to electromagnetic interference (EMI). The amount of such EMI noise that gets injected into a signal in cable 32 increases as the distance reduces between wireless device 31 and cable 32. When wireless device 31 is sufficiently close, the EMI noise picked up by cable 32 can so severely corrupt a signal carried therein that a link drop occurs. The amount of EMI noise that is picked up by a signal travelling through cable 32 depends on various characteristics of cable 32, such as shielding and grounding. When cable 32 is used to transfer data at a high rate, such as 10 Gbps, the current inventor believes that prior art shielding and become insufficient e.g. because electromagnetic fields penetrate through such shielding and induce currents in cable 32. Therefore, the current inventor believes it is necessary to cancel externally-generated noise actively, as follows.

SUMMARY

A narrowband interference (NBI) canceller in accordance with the invention includes a first arithmetic unit that receives a signal that is input to the NBI canceller ("input signal"). The first arithmetic unit also receives a predicted-interference signal internally from within the NBI canceller, and subtracts it from the input signal to generate an interference-canceled signal which lacks at least a portion of the narrowband interference. The NBI canceller includes a slicer (or other such decision device depending on how the signal was prepared for transmission). The slicer receives the interference-canceled signal from the first arithmetic unit and operates thereon in a normal manner, to generate a decision signal in the form of a series of symbols. A second arithmetic unit receives the decision signal from the slicer and subtracts it from the input signal to generate a noise signal. The noise signal includes various types of noise, such as (1) noise generated internally in the communications channel, (2) noise at one or more unknown frequencies caused by coupling of the communications channel with an external source such as a wireless device, and (3) error (if any) in decisions made by the slicer.

The NBI canceller also includes a coarse frequency estimator that receives the above-described noise signal from the second arithmetic unit and analyzes its frequency spectrum to search for narrowband interference. When the coarse frequency estimator detects narrowband interference, the coarse frequency estimator makes an estimate of a fundamental frequency of the narrowband interference. The estimated fundamental frequency is used by an interference predictor that is included in the NBI canceller to generate the predicted-interference signal described above. Specifically, the interference predictor operates directly in the time domain to generate the predicted-interference signal for use by the first arithmetic unit in subtraction from the input signal. To ensure that the predicted-interference signal remains representative of the narrowband interference over time as the narrowband interference ramps up, the interference predictor adaptively tracks the narrowband interference based on the noise signal generated by the second arithmetic unit.

In some illustrative embodiments, an NBI canceller of the type described above is included in a transceiver circuit that itself is included in a physical layer (PHY) device chip. The transceiver circuit receives an analog signal from a communications channel that is subject to narrowband interference, an example of which is electromagnetic interference (EMI) from wireless devices, such as walkie-talkies and cell phones. The transceiver circuit includes an analog-to-digital (A/D) converter that converts an analog signal received from the communications channel into a digital signal. The digital signal from the analog-to-digital converter passes through one or more intervening circuits (e.g. echo canceller) and eventually passes to the NBI canceller, as an input signal thereof. The input signal is processed by the NBI canceller of the type described herein into an interference-canceled signal, which is then supplied to a downstream stage in the transceiver circuit, such as an error correcting decoder. The error correcting decoder operates in the normal manner, e.g. to perform forward error correction (FEC) on the interference-canceled signal.

DETAILED DESCRIPTION

Figure 1:
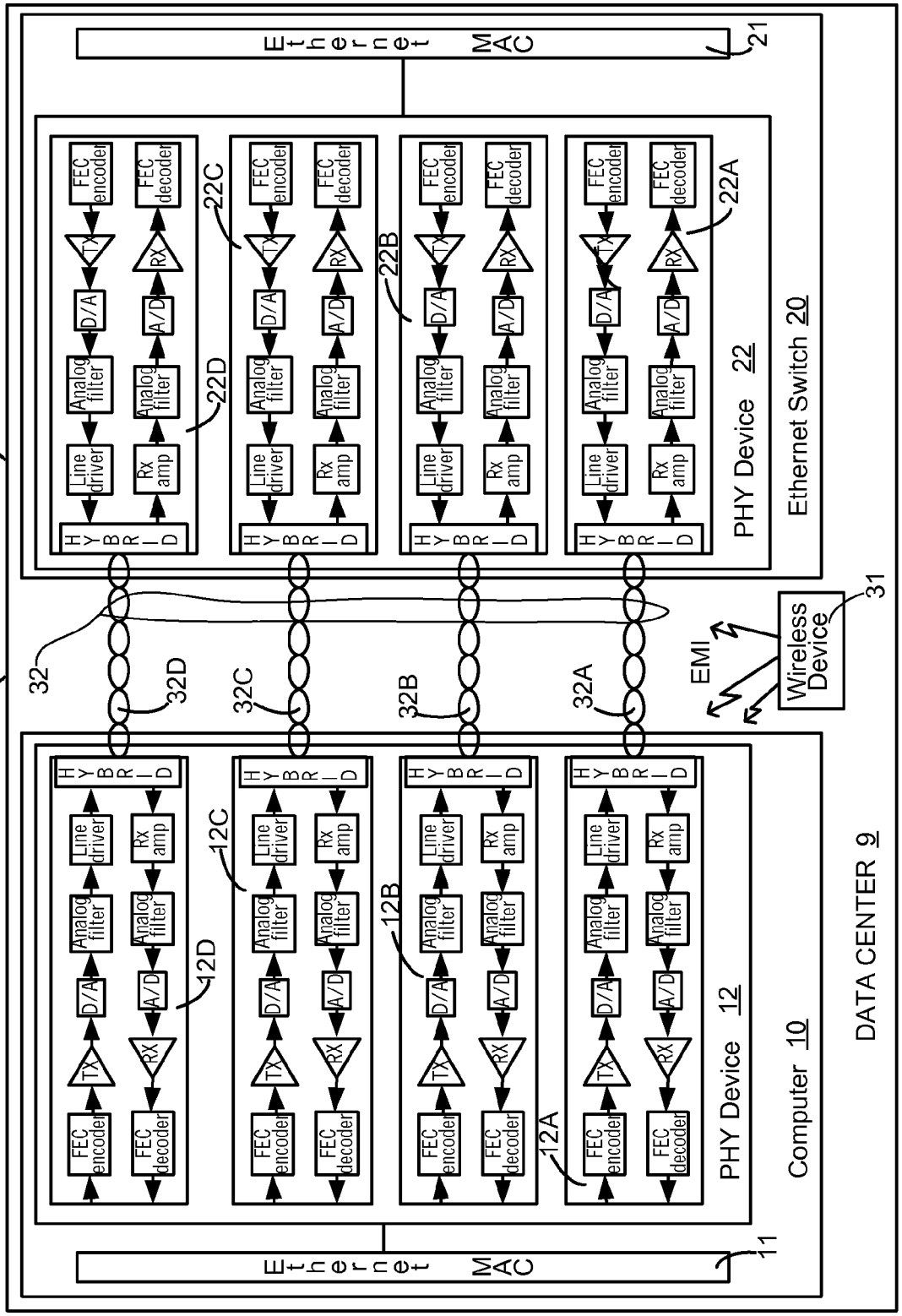
FIG. 1 illustrates, in a high level block diagram, a prior art data center 9 having a computer 10 and an Ethernet switch 20 interconnected by a cable 32, wherein cable 32 experiences electromagnetic interference (EMI) on operation of a wireless device 31.

A narrowband interference canceller 118 (FIG. 2A) in several embodiments of the invention includes two arithmetic units 126 and 127. Both arithmetic units 126 and 127 in canceller 118 receive a common input signal from an input port 118I, via corresponding input buses 126I and 127I. Input port 118I of canceller 118 is coupled to an analog to digital (A/D) converter 116 via one or more intervening circuits (together shown in a front end processing circuit 117) in a transceiver 122 illustrated in FIG. 2A. Analog to digital (A/D) converter 116 in turn is coupled through an analog amplifier 115 to a hybrid circuit 114 that combines or splits transmit and receive signals in the normal manner, within transceiver 122 of a physical layer (PHY) device 120.

PHY device 120 is coupled by up to 100 meters of unshielded or shielded copper cable 32 to another such PHY device 110 that includes its own transceiver 112. Copper cable 32 typically includes four pairs of twisted conductors, and can be, for example, any of Category 5, 6, 6a or 7 cables. Note that although cable 32 is illustratively described herein as interconnecting PHY devices 110 and 120, other embodiments may use any other communication channel that is subject to narrowband interference of the type described herein.

In an illustrative example, analog to digital (A/D) converter 116 generates samples of 11 bits each, at a sampling rate of 800 million samples per second to support a high rate of data communication (e.g. 10 Gigabits per second). However, as will be apparent to the skilled artisan, any other resolution and rate may be used to generate samples of the received signal in other embodiments of an analog to digital (A/D) converter 116.

In one illustrative example, PHY devices 110 and 120 communicate over cable 32 in conformance with the industry standard IEEE 802.3an, also known as 10GBASE-T. For more information on 10GASE-T, see the document entitled "10GBASE-T Coding and Modulation: 128-DSQ+LDPC" by Gottfried Ungerboeck, IEEE P802.3an Task Force, Ottawa, Sep. 29-Oct. 1, 2004, revised 27 September 4, which is incorporated by reference herein in its entirety. For additional details, see another document entitled "802.3an-2006 IEEE Standard for Information Technology-Telecommunications and Information Exchange Between Systems-Local and Metropolitan Area Networks-Specific Requirements Part 3: Carrier Sense Multiple Access With Collision Detection (CSMA/CD) Access Method and Physical Layer Specifications."

Within transceiver 122, front end processing circuit 117 typically includes one or more cancellers, such as an echo canceller, and/or one or more crosstalk cancellers such as a NEXT canceller, and a FEXT canceller, connected to other circuitry normally used downstream of an A/D converter in a data communication transceiver, such as a timing recovery circuit and an automatic gain control (AGC) circuit. Implementation of front end processing circuit 117 is not further described herein as being readily apparent to the skilled artisan.

An input signal received at port 118I of narrowband interference canceller 118 is a digital representation in the time domain of an analog signal, in the form of a series of samples that occur at a fixed rate over time. Specifically, the input signal at port 118I results from inversion of a corresponding signal in the frequency domain e.g. by an inverse-fast-fourier-transform (IFFT) stage included in front end processing circuit 117. Hence, each sample of the input signal at port 118I includes at least the following components: (1) a signal transmitted on cable 32 by a remote transceiver 112 in a PHY device 110 (also called "link partner"), (2) noise ("residual noise") that remains after a signal digitized by A/D converter 116 is processed by one or more cancellers in front end processing circuit 117 to cancel internally-generated noise (i.e. noise generated internally in communications channel 32 even in the absence of electromagnetic interference) and (3) electromagnetic interference, if any, injected into the signal carried by cable 32 on operation of a wireless device, such as a walkie-talkie 31 in the vicinity of cable 32.

Figure 2A:
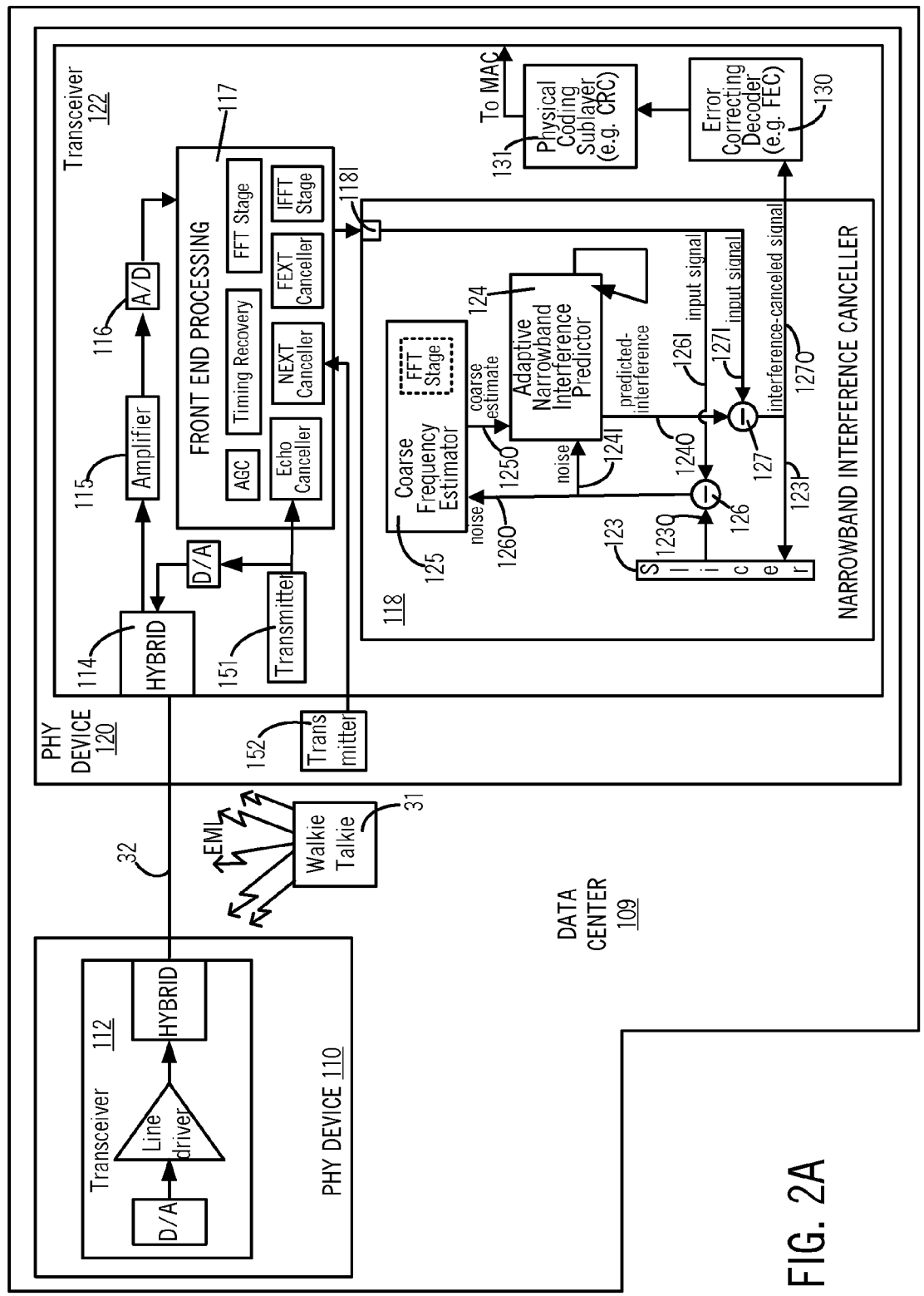
FIG. 2A illustrates, in a high level block diagram, a physical layer (PHY) device 120 including a transceiver 122 that in turn includes a narrowband interference canceller 118 in accordance with the invention.

Referring to FIG. 2A, an arithmetic unit 127 (also called "first arithmetic unit") in narrowband interference canceller 118 receives the above-described input signal and additionally also receives via another bus 124O, a predicted-interference signal that is generated internally within NBI canceller 118 by an adaptive narrowband interference predictor 124, as described below. First arithmetic unit 127 operates in the time domain to subtract the predicted-interference signal from the input signal received on input bus 127I (at this stage, also called "first signal"), thereby to generate a narrowband interference-cancelled signal, which lacks at least a portion of the narrowband interference in the signal received on port 118I. First arithmetic unit 127 supplies the narrowband interference-cancelled signal on an output bus 127O that is coupled to a stage downstream (in a receive data path) from NBI canceller 118, such as an error correcting decoder 130.

Error correcting decoder 130 in transceiver 122 operates in the normal manner, e.g. to perform forward error correction (FEC) on the narrowband interference-cancelled signal received from bus 127O. In an illustrative example, a FEC decoder 130 is implemented by a Low Density Parity Checking (LDPC) circuit (not shown in FIG. 2A), in accordance with the 10GBASE-T or IEEE 802.3an specification. As will be readily apparent to the skilled artisan, instead of an LDPC circuit, any other circuit may be used to perform FEC decoding to reverse the FEC encoding performed by a remote transceiver 112.

Error correcting decoder 130 is coupled to a physical decoding circuit 131 also included in transceiver 122, to supply thereto the FEC decoded signal. Physical decoding circuit 131 in turn is coupled by a port 122O of transceiver 122 to a media access controller (MAC) device (not shown in FIG. 2A). Physical decoding circuit 131 performs various functions normally performed at the physical layer, before transmission to a layer-2 device (i.e. MAC device), such as framing and cyclic redundancy check (CRC). Depending on the embodiment, output port 122O of transceiver 122 may conform to an industry standard, such as Ten Gigabit Media Independent Interface (XGMII) or Ten Gigabit Attachment Unit Interface (XAUI).

In several embodiments of the invention, NBI canceller 118 also includes a slicer 123 (FIG. 2A) that receives the interference-canceled signal on a bus 123I coupled to the first arithmetic unit 127. Slicer 123 operates in the normal manner on the interference-canceled signal, to generate a series of symbols of a decision signal on a bus 123O (see act 211 in FIG. 2B). Slicer 123 makes its decision to identify a symbol (also called "PAM" symbol) by picking one of a number of discrete levels (such as 16 levels) that may be used in pulse amplitude modulation (PAM) of a signal transmitted by remote transceiver 112. For example, slicer 123 may pick as the PAM symbol in the decision signal, whichever one of 16 levels is closest to a sample in a series of digital samples in the input signal received by NBI canceller 118 at input port 118I. The samples in the input signal at port 118I are the result of front end processing by circuit 117 after the magnitude of an analog signal is sampled in the time domain by A/D converter 116. More specifically, the samples received at input port 118I of some embodiments are generated by an inverse fast fourier transform (IFFT) stage in circuitry 117. The IFFT stage is used in circuit 117, e.g. to convert a signal to the time domain, after the signal has been processed by a canceller in the frequency domain.

In the embodiments described in the previous paragraph, slicer 123 may perform additional decoding, for example, by use of 128 Double Square Constellation (DSQ) symbols if such symbols have been used by remote transceiver 112 to encode the transmitted signal on cable 32. In one specific illustrative embodiment, slicer 123 operates in accordance with the 10GBASE-T or IEEE 802.3an specification. For more information on a slicer used in the illustrative embodiment, see a document entitled "10GBASE-T Coding and Modulation: 128-DSQ+LDPC" by Gottfried Ungerboeck which has been incorporated by reference above. As will be apparent to the skilled artisan, instead of slicer 123, any other decision device may be used to generate a decision signal (in the form of a time series of PAM symbols) in some embodiments, depending on encoding and modulation used by remote transceiver 112.

A second arithmetic unit 126 is coupled to bus 123O to receive the decision signal from slicer 123 (or alternatively any other decision signal from a decision device of alternative embodiments). Second arithmetic unit 126 subtracts the decision signal from the input signal (also called "first signal" at this stage), to generate a noise signal (see act 212 in FIG. 2B). The noise signal includes various types of noise, such as (1) noise internally generated in the communications channel 32 and remaining after upstream processing to cancel various types of noise, such as echo cancellation, FEXT cancellation and NEXT cancellation by front end processing circuitry 117 (2) noise caused by an external source such as a wireless device 31, and (3) error (if any) in decisions made by slicer 123.

Figure 2B:
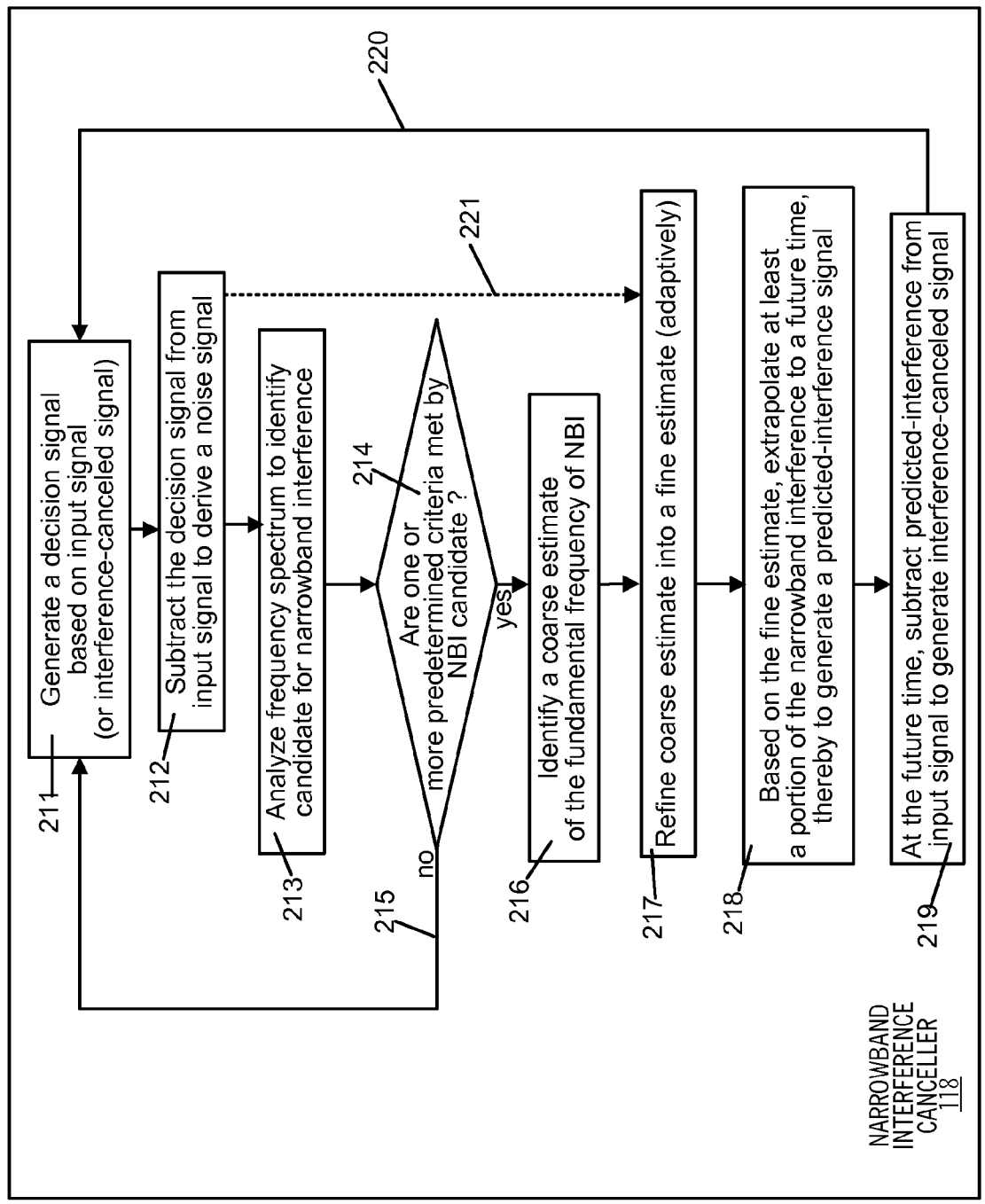
FIG. 2B illustrates, in a high level flow chart, a method performed by a narrowband interference canceller 118 in accordance with the invention.

NBI canceller 118 (FIG. 2A) also includes a coarse frequency estimator 125 that receives on a bus 126O the just-described noise signal from the second arithmetic unit 126. Note that coarse frequency estimator 125 illustrated in FIG. 2A does not receive any other data signal. Instead, coarse frequency estimator 125 directly analyzes the frequency spectrum of the noise signal received on bus 126O to identify a candidate for narrowband interference (see act 213 in FIG. 2B). During analysis by coarse frequency estimator 125, on checking if at least one predetermined criterion is met by the narrowband interference candidate (see act 214 in FIG. 2B), most of the time the answer is no (see branch 215), i.e. no narrowband interference is found by coarse frequency estimator 125. Specifically, branch 215 in FIG. 2B is taken a majority of time, e.g. because no narrowband interference is coupled into cable 32, e.g. if there is no source of EMI in the vicinity. Hence, acts 211-214 are repeatedly performed as long as there is no narrowband interference in the signal on cable 32.

Sporadically, narrowband interference may arise at an unknown frequency e.g. when a walkie-talkie or cell phone or other wireless device 31 is operated sufficiently close to cable 32 of the type described above. In some embodiments, several predetermined criteria are identified and configured into coarse frequency estimator 125 (e.g. stored in a memory therein) ahead of time so that when unknown narrowband interference does arise, at least one predetermined criterion is met. Hence, occasionally, when narrowband interference is present, the answer in act 214 (FIG. 2B) is yes, and coarse frequency estimator 125 automatically prepares (and in some embodiments stores in a computer memory) an estimate of an attribute of the narrowband interference (as per act 216 in FIG. 2B), e.g. a frequency thereof.

An estimate ("coarse estimate") prepared by coarse frequency estimator 125 is coarser than a finer estimate that is prepared later in NBI canceller 118. For example, a coarse estimate of a frequency of the narrowband interference may be identified by coarse frequency estimator 125 to be one of N frequencies. In the just-described example, N is the number of samples used by a fast fourier transform (FFT) stage included in coarse frequency estimator 125 to convert the noise signal on bus 126O to the frequency domain. In one illustrative example N is 512 whereas in another example N is 256. Coarse frequency estimator 125 uses its FFT stage to operate on the noise signal in the frequency domain, to identify and optionally confirm the presence of a candidate for narrowband interference. Coarse frequency estimator 125 operates without adaptation, and hence a coarse estimate of the attribute (such as the fundamental frequency) is prepared rapidly, e.g. in some embodiments within the same clock cycle as the detection of narrowband interference.

A coarse estimate which is non-adaptively prepared by coarse frequency estimator 125 is later refined (as per act 217 in FIG. 2B) into a fine estimate having a finer resolution than the coarse estimate (i.e. finer than 1/N), by an adaptive narrowband interference predictor 124 also included in NBI canceller 118. Specifically, adaptive narrowband interference predictor 124 is coupled by bus 125O to coarse frequency estimator 125 to receive therefrom the coarse estimate. Adaptive narrowband interference predictor 124 refines the coarse estimate into the fine estimate, and does so adaptively while the frequency spectrum of the narrowband interference is changing (e.g. between successive clock cycles in NBI canceller 118).

Adaptive narrowband interference predictor 124 additionally uses the fine estimate to extrapolate at least a portion of the narrowband interference (in the time domain) by a predetermined duration, to a time in future (also called "extrapolated time", which may be e.g. at a next rising edge in a clock cycle). The predetermined duration is selected, in certain illustrative embodiments, based on latency in a path that starts from bus 127I, passes through arithmetic unit 127, bus 123I, slicer 123, bus 123O, arithmetic unit 126, bus 126O, coarse frequency estimator 125, bus 125O, adaptive narrowband interference predictor 124 and ends at bus 124O. For example the predetermined duration may be set equal to the just-described delay, counted in clock cycles. Adaptive narrowband interference predictor 124 supplies the result of extrapolation on bus 124O as a predicted-interference signal (see act 218 in FIG. 2B). Adaptive narrowband interference predictor 124 prepares the predicted-interference signal based on the narrowband interference which is received as a portion of the noise signal on bus 124I, from second arithmetic unit 126.

When the extrapolated time occurs, first arithmetic unit 127 subtracts (in the time domain) the predicted-interference signal from the input signal (also called "first signal") on bus 127I to generate a narrowband interference-cancelled signal (as per act 219). Thereafter, as shown by branch 220, act 211 is again performed, although at this time the decision signal generated by slicer 123 in act 211 is based on the interference-canceled signal on bus 123I instead of the input signal. Referring to FIG. 2B, after act 211 is performed, a next act 212 (described above) is performed by arithmetic unit 126 to subtract the decision signal on bus 123O from the input signal (also called "first signal") on bus 126I, to derive the noise signal supplied on buses 126O and 124I.

To recapitulate the method described above as shown in FIG. 2B, initially there is no narrowband interference, and the signal on bus 123I received from arithmetic unit 127 is same as the first signal on bus 127I which in turn is same as the input signal received from input port 118I. In this early stage, the predicted-interference signal is zero and slicer 123 (or other such decision device) operates directly on the first signal to generate the decision signal on bus 123O, as shown by branch 215. Later on, when narrowband interference arises (and one or more predetermined criteria is/are met in act 214), a predicted version of the narrowband interference becomes non-zero and is subtracted from the first signal on bus 127I by arithmetic unit 127 (as per act 219), at which time the signal on bus 123I becomes the interference-canceled signal. At this later stage, slicer 123 (or other such decision device) operates on the interference-canceled signal as shown by branch 220 in FIG. 2B. As the decision signal on bus 123O is now generated by slicer 123 based on the interference-canceled signal, the noise signal generated on buses 124I and 126O by arithmetic unit 126 performing act 212 has minimal or no slicer error. Therefore, due to a change in the signal that slicer 123 (or other such decision device) operates on (from the input signal initially, to the interference-canceled signal after detection of narrowband interference), the decision signal generated by slicer 123 on performance of act 211 has minimal or no error.

Reduction or elimination of slicer error in NBI canceller 118 as described above enables transceiver 122 of some embodiments to receive and process a 10 Gbit/s signal without link drop over 100 meters of CAT5e/6/6a/7 cable, at least on certain of the occasions when narrowband interference occurs and BER remains below an acceptable threshold. In such embodiments, as narrowband interference gets cancelled by NBI canceller 118, a bit error rate (BER) from downstream processing of the interference-canceled signal remains below a preset threshold, e.g. less than $10^{-12}$ (i.e. one bit in $10^{12}$ bits) even as EMI noise arises from a wireless device 19 such as a walkie-talkie or a cell phone. As noted above, in one illustrative example, the above-described NBI canceller 118 is used in a transceiver 122 that conforms to the 10GBASE-T or IEEE 802.3an specification. In some embodiments, NBI cancellers of the type described above are used in a local area network that is housed in a location that is subject to unknown and sporadic narrowband interference, such as in a data center.

In some embodiments, when narrowband interference has just been detected, there is no need to perform acts 213-216 in FIG. 2B. Hence, these acts 213-216 are skipped as shown by branch 221, and the just-detected narrowband interference is adaptively tracked over time, as per act 217 (described above), following which acts 218 and 219 are performed (also as described above). Specifically, NBI canceller 118 in some embodiments loops over 221, 217, 218, 219, 220, 211 and 212 shown in FIG. 2B as follows. On detecting narrowband interference, NBI canceller 118 starts to cancel at least a portion of the narrowband interference in its input signal, thereby to generate an interference-canceled signal which is used in a feedback loop with slicer 123 to minimize or eliminate slicer error in its decision signal used internally by NBI canceller 118 to extract narrowband interference and predict it for cancellation. Although acts 213-216 are skipped in some embodiments, in other embodiments, acts 213-216 continue to be performed even though a narrowband interference has just been detected, so as to search for and detect other narrowband interferences (e.g. from other wireless devices or cell phones).

Note that NBI canceller 118 illustrated in FIG. 2A includes its own slicer 123 that generates a decision signal used by arithmetic unit 126 to generate a noise signal supplied to each of coarse frequency estimator 125 and adaptive narrowband interference predictor 124. Hence, NBI canceller 118 of some embodiments has only one input port to receive data, namely port 118I wherein the input signal received is output by an upstream circuit in the receive data path, such as an IFFT stage in front end processing circuit 117. More specifically, by use of its own slicer 123 and arithmetic unit 126, NBI canceller 118 of FIG. 2A eliminates the need to receive any reference signal from outside of NBI canceller 118, unlike an echo canceller that may receive a reference signal in the form of symbols being transmitted by transmitter 151 via hybrid 114 to cable 32, and unlike a NEXT canceller that may receive symbols being transmitted by another transmitter 152 in PHY device 120.

Figure 2C:
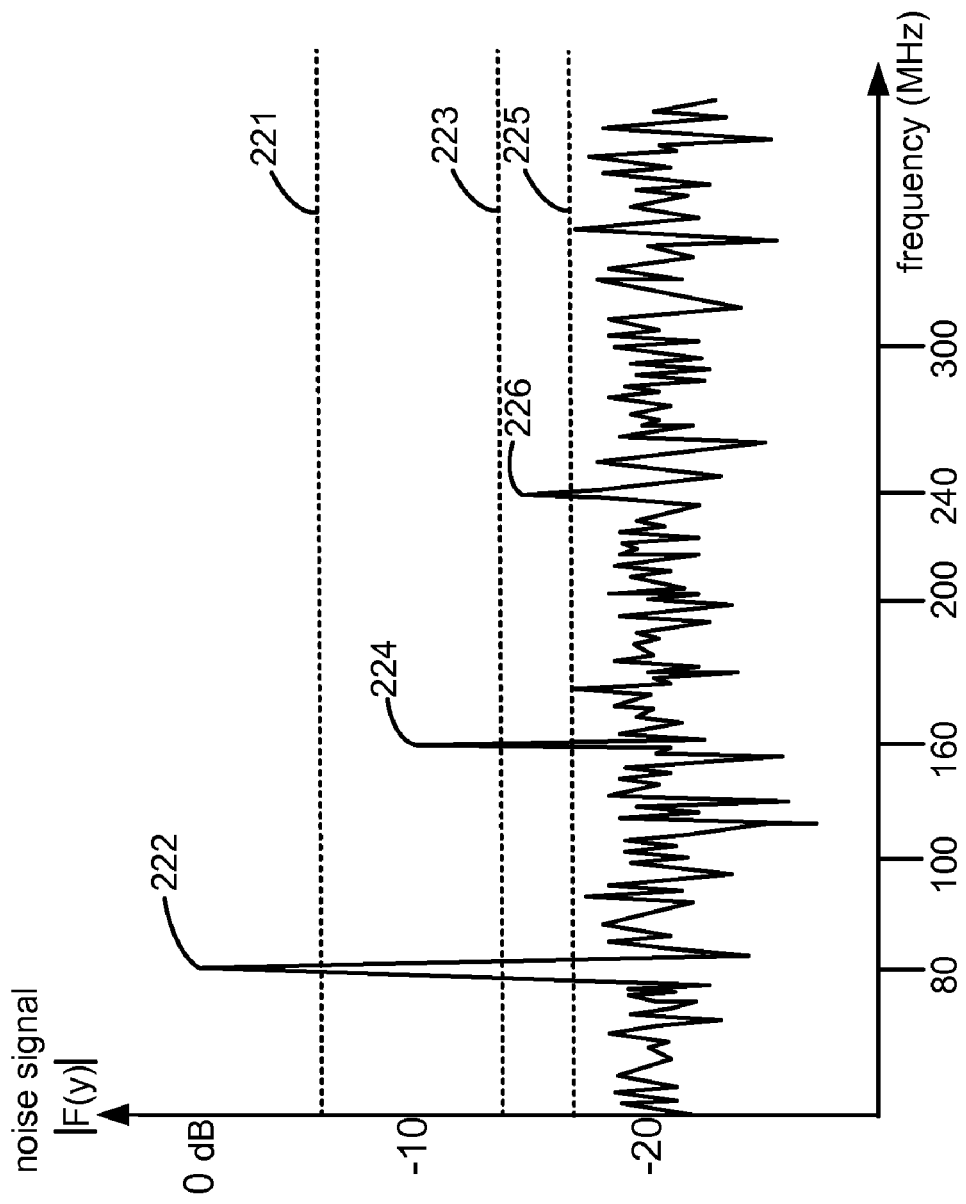
FIG. 2C illustrates, in a graph, a noise signal generated by the arithmetic unit 126 (FIG. 2A), and thresholds 221, 223 and 225 applied thereon by coarse frequency estimator 125 (FIG. 2A).

In some illustrative embodiments, coarse frequency estimator 125 estimates a fundamental frequency of the narrowband interference non-adaptively. The term fundamental frequency denotes a lowest frequency at which a peak occurs in the frequency spectrum of the narrowband interference in the noise signal. For example, FIG. 2C illustrates a frequency domain representation of a noise signal on bus 126O. The noise signal of FIG. 2C has a peak 222 at frequency 80 MHz, another peak 224 at frequency 160 MHz and yet another peak 226 at frequency 160 MHz. In the illustrative embodiments, coarse frequency estimator 125 detects each of peaks 222, 224 and 226 when noise signal 220 exceeds corresponding thresholds 221, 223 and 225 respectively, which constitute predetermined criteria described above in reference to act 214 in FIG. 2B.

Figure 3A:
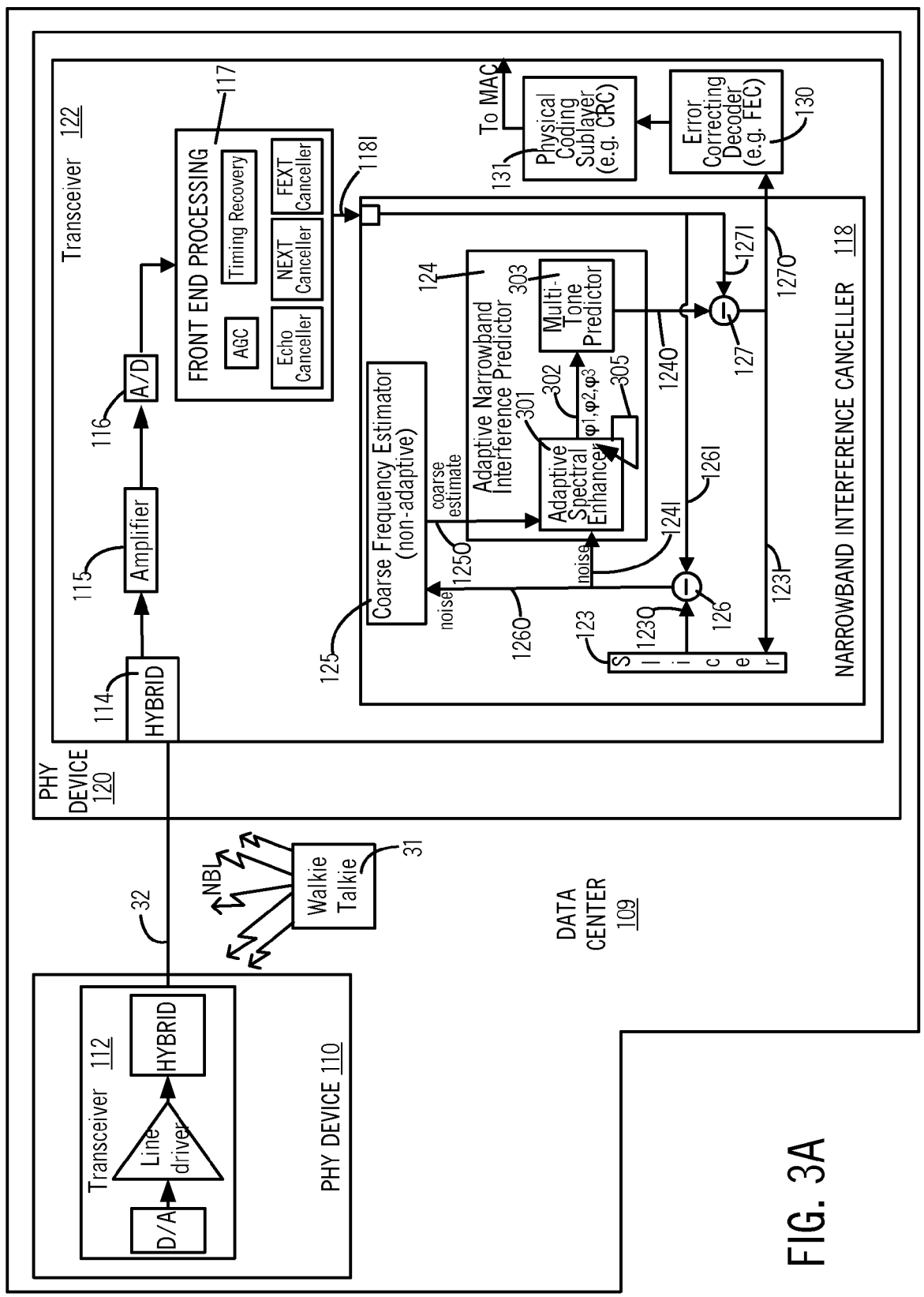
FIG. 3A illustrates, in an intermediate level block diagram, an illustrative aspect of an adaptive narrowband interference predictor 124 of FIG. 2A.

In several embodiments, adaptive narrowband interference predictor 124 is implemented by two circuits, namely an adaptive spectral enhancer 301 and a multi-tone predictor 303 interconnected by a bus 302 as illustrated in FIG. 3A. Adaptive spectral enhancer 301 receives the coarse estimate of the fundamental frequency from bus 125O and adaptively refines the coarse estimate into a fine estimate of the fundamental frequency, e.g. by spectral enhancement and/or harmonic separation of the noise signal received on bus 124I. Adaptive spectral enhancer 301 also simultaneously uses the fine estimate prepared therein to extract from the noise signal, multiple tones of the narrowband interference, e.g. a first tone φ1 at a first frequency ω1 and two additional tones φ2 and φ3 respectively at a second frequency ω2 and a third frequency ω3. In certain illustrative embodiments, the second frequency ω2 is a second harmonic of the first frequency ω1 and the third frequency ω3 is a third harmonic thereof.

Adaptive spectral enhancer 301 supplies the three tones φ1, φ2 and φ3 on bus 302 to multi-tone predictor 303. Multi-tone predictor 303 extrapolates each of the three tones φ1, φ2 and φ3 individually, up to an extrapolated time in future (described above) and combines the results of extrapolation to generate a predicted-interference signal supplied on bus 124O. In some embodiments, adaptive spectral enhancer 301 uses an error signal on bus 305 that is obtained by notching the noise signal with one or more tones φ1, φ2 and φ3 to adaptively track the narrowband interference in the noise signal.

In certain illustrative embodiments of the invention, adaptive narrowband interference predictor 124 and adaptive spectral enhancer 301 are described in either one or both of two U.S. patent applications, with Dariush Dabiri as the first-named inventor, that are concurrently filed herewith, and co-owned as follows:

(1) "Adaptive Narrowband Interference Prediction Circuit and Method", Ser. No. 12/952,184; and
(2) "Adaptive Spectral Enhancement and Harmonic Separation", Ser. No. 12/952,178.

The just-described two patent applications are hereby incorporated by reference herein, in their entirety.

Instead of adaptive spectral enhancer 301, an adaptive bandpass filter may be used in alternative embodiments, e.g. if the narrowband interference coupled into cable 32 has negligible energy at frequencies other than the fundamental frequency. In such alternative embodiments, a single-tone predictor may be used instead of a multi-tone predictor.

Figure 3B:
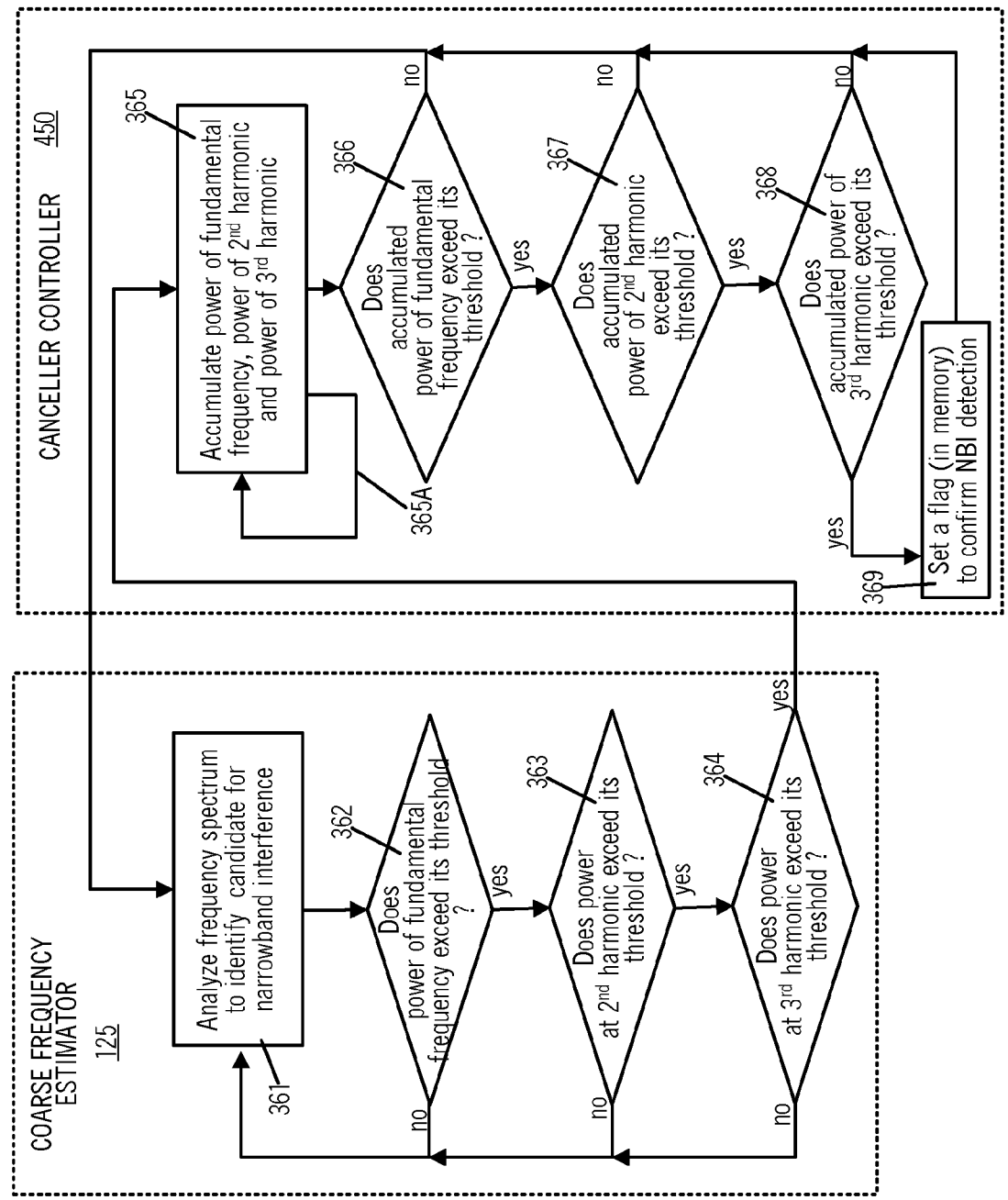
FIG. 3B illustrates, in an intermediate level flow chart, acts 361-364 performed by coarse frequency estimator 125 and acts 365-369 performed by canceller controller 450 both included in a narrowband interference canceller of some embodiments.

In some embodiments of the invention, a coarse frequency estimator 125 performs acts 361-364 illustrated in FIG. 3B. Specifically, in an act 361, coarse frequency estimator 125 analyzes the frequency spectrum of the noise signal received on bus 126O, to identify one or more candidates for narrowband interference. The specific manner in which an NBI candidate is identified is different in different embodiments. In some illustrative embodiments, NBI candidates are identified by matrix multiplication as described in a related patent application, with Dariush Dabiri as the first-named inventor, that is concurrently filed herewith, and co-owned as follows:

(3) "Detection and Estimation of Narrowband Interference By Matrix Multiplication", Ser. No. 12/952,164.

The just-described patent application is hereby incorporated by reference herein, in its entirety.

Next, coarse frequency estimator 125 checks if three frequencies f1, f2 and f3 at which the three thresholds 221, 223 and 225 (see FIG. 2C) are exceeded, relate to one another as harmonics, and this checking is also referred to as harmonic analysis. The specific manner in which harmonic analysis is performed is different in different embodiments. In some illustrative embodiments, harmonic analysis is performed as described in a related patent application, with Dariush Dabiri as the first-named inventor, that is concurrently filed herewith, and co-owned as follows:

(4) "Confirmation of Presence of Narrowband Interference By Harmonic Analysis", Ser. No. 12/952,172.

The just-described patent application is hereby incorporated by reference herein, in its entirety.

In an embodiment illustrated in FIG. 3B, a first act (see act 362) in harmonic analysis requires checking whether a frequency f1 selected as the lowest frequency among all frequencies at which peaks occur, has a power that exceeds a first preset threshold for the fundamental frequency. In this illustrative embodiment, if the result of act 362 is true, harmonic analysis requires checking (in act 363) if doubling of frequency f1 results in a second harmonic frequency whose power exceeds a second preset threshold (for the second harmonic). Alternatively, act 363 may check if the second harmonic frequency differs from one of frequency f2 and frequency f3 within a preset tolerance (e.g. 10%). Furthermore, if the result of act 363 is true, harmonic analysis of this embodiment also checks (in act 364) if tripling of frequency f1 results in a third harmonic frequency whose power exceeds a third preset threshold (for the third harmonic). If a condition is not met in any of acts 362-364, coarse frequency estimator 125 simply returns to act 361. In some embodiments, second harmonic checking in act 363 accounts for aliasing caused by use of an FFT stage, by checking one or more additional conditions, e.g. when the product 2*f1 happens to exceed the frequency at N/2, wherein N is the number of frequencies (or bins) generated by the FFT stage.

Figure 4A:
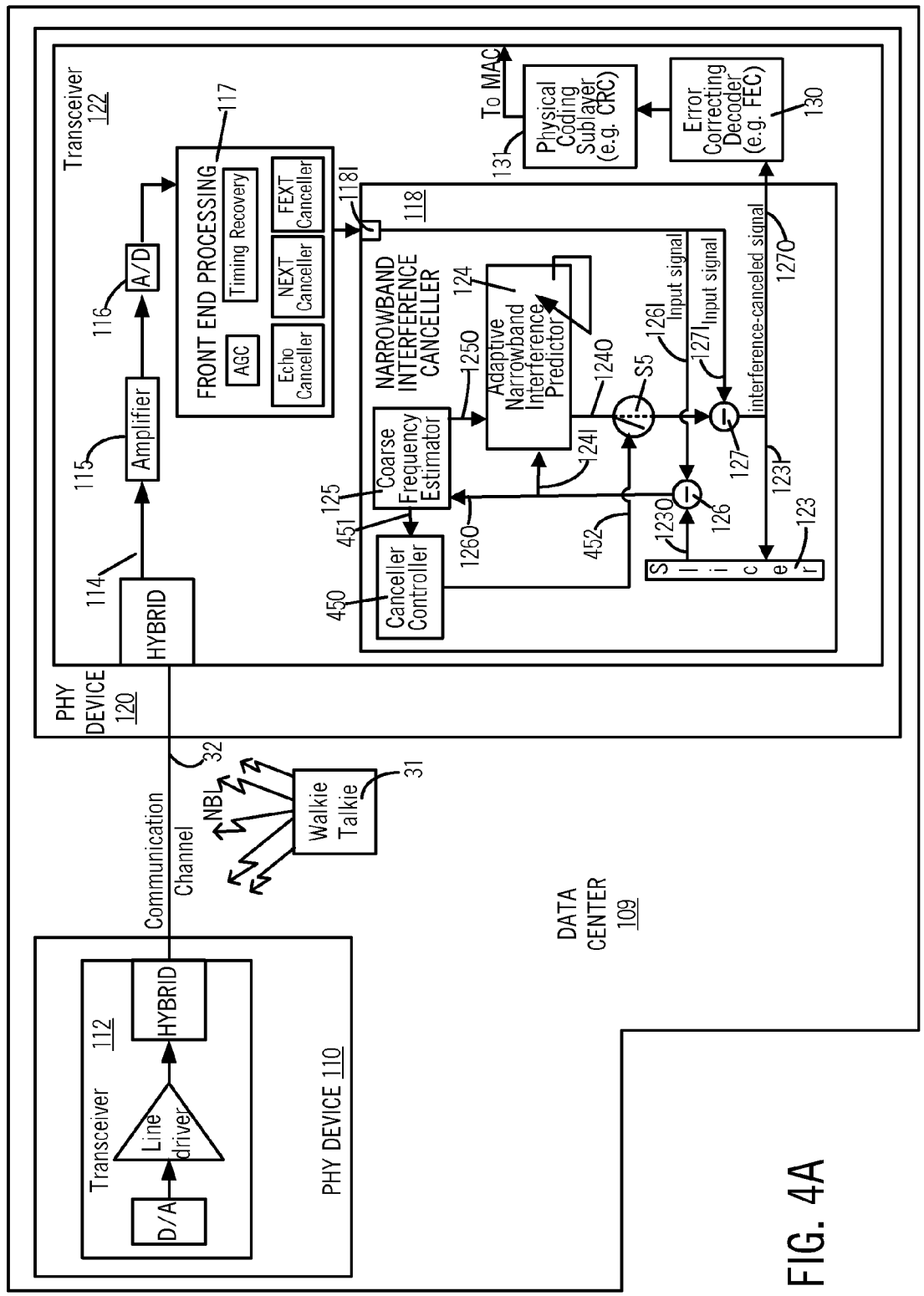
FIG. 4A illustrates, in another high level block diagram, a narrowband interference canceller 118 that includes a canceller controller 450 and a switch S5 in some embodiments of the invention.

In certain illustrative embodiments of the invention, NBI canceller 118 includes a canceller controller 450 (FIG. 4A) that performs acts 365-369 illustrated in FIG. 3B when the coarse frequency estimator 125 completes harmonic analysis and confirms the presence of narrowband interference. Specifically, in act 365, canceller controller 450 accumulates the power of each of the three tones $\phi 1$, $\phi 2$ and $\phi 3$ that are generated by adaptive spectral enhancer 301 and does so repeatedly (shown as branch 365A in FIG. 3B) for a preset duration (which is provisioned). Next, canceller controller 450 goes to act 366 to check if the accumulated power of a first tone $\phi 1$ at the fundamental frequency exceeds a fourth preset threshold (for accumulation at the fundamental frequency). If the result of act 366 is true, then canceller controller 450 also checks if the accumulated power of a second tone $\phi 2$ at the second harmonic exceeds a fifth preset threshold (for accumulation at the second harmonic). Also, if the result of act 367 is true, then canceller controller 450 also checks if the accumulated power of a third tone $\phi 3$ at the third harmonic exceeds a sixth preset threshold (for accumulation at the third harmonic). Finally, if the result of act 368 is true, then canceller controller 450 sets a flag in memory (as per act 369) to confirm the detection of narrowband interference. If a condition is not met in any of acts 366-368, canceller controller 450 instructs coarse frequency estimator 125 to return to act 361.

Figure 4B:
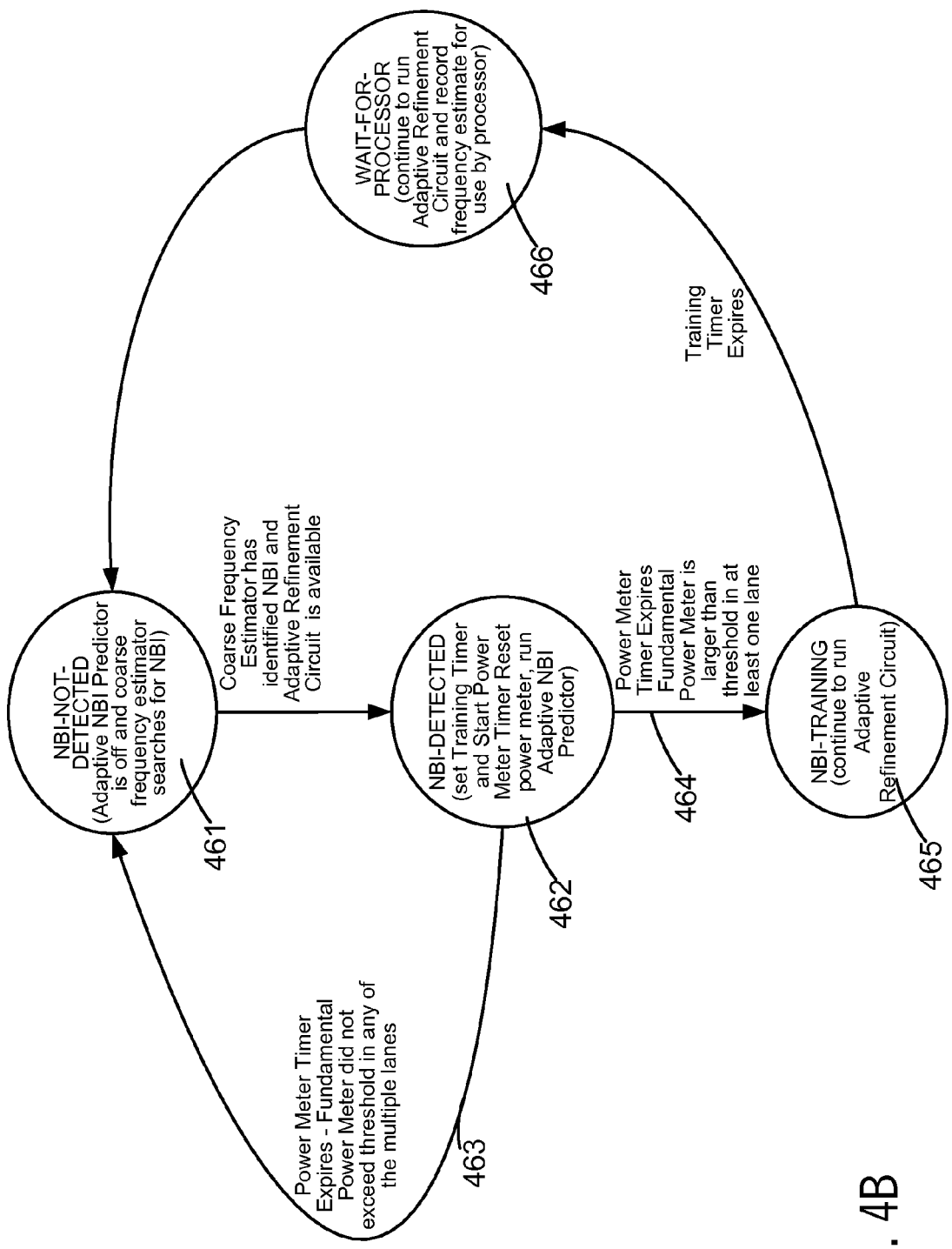
FIG. 4B illustrates, in a high level state transition diagram, operation of the canceller controller 450 of FIG. 4A.

In some embodiments, canceller controller 450 (FIG. 4A) is implemented as a state machine of the type illustrated in FIG. 4B as follows. Specifically, controller 450 is initially in a first state 461 ("NBI-NOT-DETECTED" state). In this first state 461, adaptive narrowband interference predictor 124 (see FIG. 4A) is not in use, and coarse frequency estimator 125 is searching for NBI. In this first state 461 (see FIG. 4B), the input signal in the time domain (output by an IFFT stage in circuitry 117) is directly supplied on an input bus 127I (see FIG. 4A) as a "first signal" to subtractor 127. Also in this first state, switch S5 is open and therefore subtractor 127 simply passes the first signal received on bus 127I directly to bus 123I. Slicer 123 slices the signal received on bus 123I to generate a series of symbols in the time domain that form a decision signal. The symbols in turn are supplied on bus 123O to a subtractor 126. Subtractor 126 in turn subtracts the symbols received on bus 123O from the first signal (which is the input signal) also carried on input bus 126I and supplies a noise signal on bus 126O to coarse estimator 125, for analysis to detect presence therein of EMI noise.

Next, at some point in time, an EMI source 31 (FIG. 4A) starts generating narrowband interference in cable 32, and coarse estimator 125 finds that predetermined criteria (as per act 214 in FIG. 2B) have been met. Therefore, coarse estimator 125 drives a signal active on a bidirectional bus 451 to/from controller 450 (FIG. 4A) to indicate that NBI has been detected. Controller 450 responds by checking that adaptive narrowband interference predictor 124 is now available (i.e. not being used to identify and cancel EMI noise from another source). If predictor 124 is available, controller 450 transitions to a second state 462 (see "NBI-DETECTED" state in FIG. 4B) and otherwise stays in the first state 461 (see "NBI-NOT-DETECTED" state in FIG. 4B). Note that initially, controller 450 sends reset signals and thresholds to coarse estimator 125 on bidirectional bus 451.

Figure 5A:
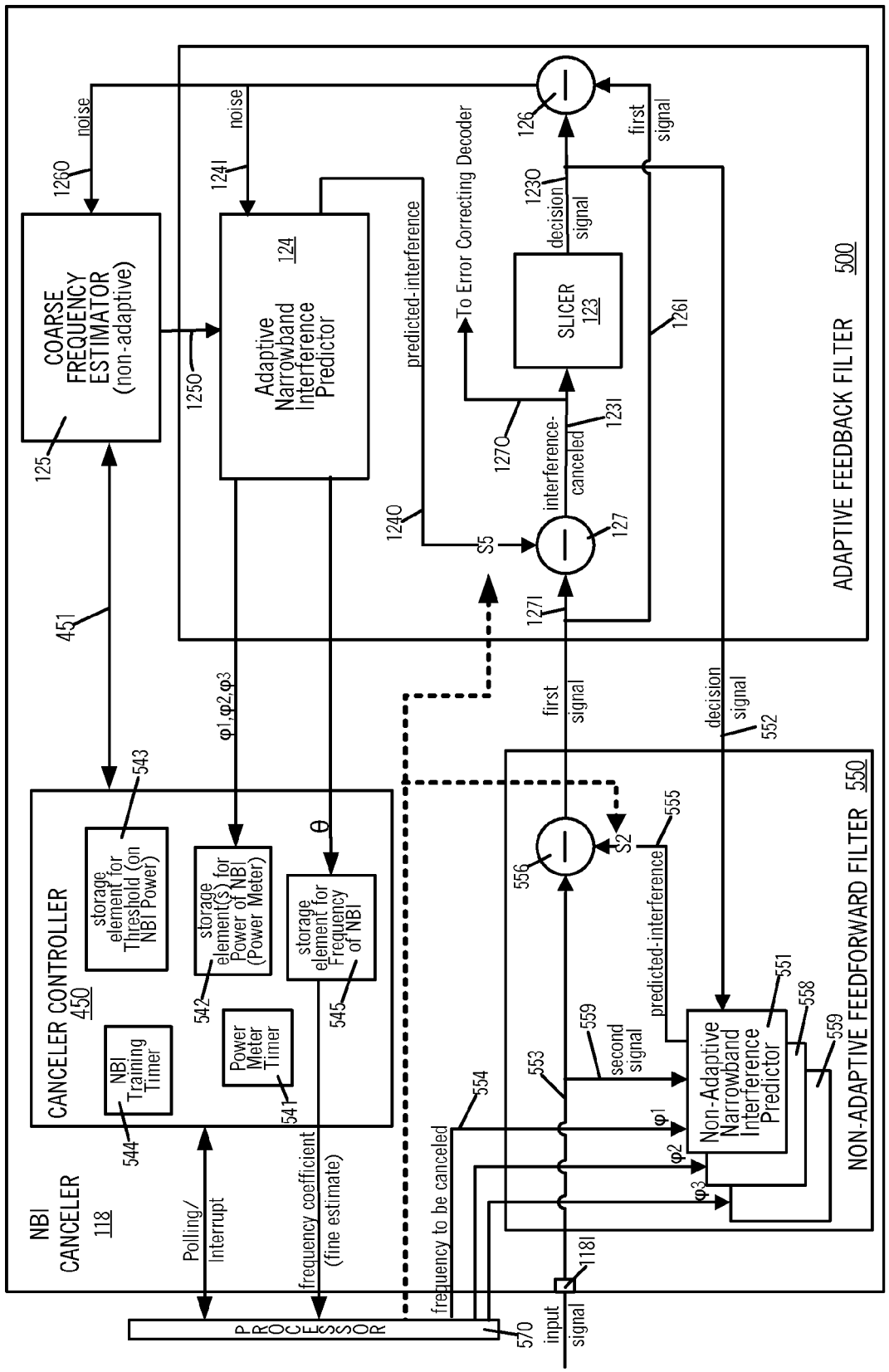
FIG. 5A illustrates, in still another high level block diagram, a narrowband interference canceller 118 that includes a non-adaptive feedforward filter 550 in addition to an adaptive feedback filter 500 and switching therebetween by a processor 570 included in a physical layer (PHY) device 120 of some embodiments.

In the second state 462 ("NBI-DETECTED" state), controller 450 re-confirms that the narrowband interference detected by coarse estimator 125 is not a false alarm, e.g. by accumulating the power of the narrowband interference over a period of time and comparing the accumulated power to a threshold. Specifically, on entering the second state, controller 450 initiates operation of the adaptive narrowband interference predictor 124 described above, resets a storage element that functions as power meter 542 (see FIG. 5A) and starts a timer 541 ("power meter timer"). Thereafter, magnitude of a fundamental tone $\phi 1$ at frequency $\omega 1$ (in the frequency domain) is accumulated in power meter 542 (as per act 365 in FIG. 3B), until timer 541 expires. When power meter timer 541 (see FIG. 5A) expires, if the value in power meter 542 does not exceed a preset threshold (identified in storage element 543) for the tone $\phi 1$ then controller 450 returns to the first state 461 ("NBI-NOT-DETECTED" state) as per branch 463 (FIG. 4B). The transition via branch 463 occurs when the NBI detected by coarse estimator 125 is determined by NBI canceller 118, to be a false alarm or sufficiently low to be disregarded (i.e. not canceled).

If the value in power meter 542 (FIG. 5A) does exceed the threshold in storage element 543 when power meter timer 541 expires, then controller 450 transitions to a third state 465 (see "NBI-TRAINING" state in FIG. 4B) as per branch 464, in order to cancel the narrowband interference by use of narrowband interference predictor 124 to estimate the narrowband interference. Although in some embodiments, only the magnitude of the fundamental tone $\phi 1$ is accumulated and checked for transition into third state 465, in other embodiments the magnitudes of each of the three tones $\phi 1$, $\phi 2$ and $\phi 3$ are accumulated and checked against corresponding thresholds before transition into third state 465.

On entry into third state 465 ("NBI-TRAINING" state), controller 450 starts a training timer 544. Additionally, on entry into the third state 465, controller 450 closes switch S5 and therefore subtractor 127 subtracts the estimated narrowband interference generated by narrowband interference predictor 124 from the first signal received on another input bus 127I and supplies an NBI-canceled signal on bus 123I to slicer 123. Therefore, in the third state ("NBI-TRAINING" state), slicer 123 slices the NBI-canceled signal to generate the symbols which are relatively free of narrowband interference. Hence, in the third state ("NBI-TRAINING" state), switch S5 is closed.

When the EMI training timer expires, then controller 450 transitions from the third state 465 to a fourth state 466 ("WAIT-FOR-PROCESSOR" state). On entry into the fourth state, controller 450 records the fine estimate of the fundamental frequency of the narrowband interference in a storage element 545, and sends an interrupt to a processor 570 included in PHY device 120 (or alternatively sets a flag in a register to be polled by processor 570). Thereafter, controller 450 simply waits in state 466 to be reset by processor 570. In response to a reset by processor 570, controller 450 goes to the first state 461 (described above).

In some embodiments of NBI canceller 118, an adaptive feedback filter 500 (FIG. 5A) is formed by the following items: bus 127I, arithmetic unit 127, bus 123I, slicer 123, bus 123O, arithmetic unit 126, bus 124I, adaptive narrowband interference predictor 124 and bus 124O. In the just-described embodiments, NBI canceller 118 additionally includes a non-adaptive feedforward filter 550 that is initially switched off, by a switch S2 therein being opened. Specifically, when there is no NBI in the input signal on input port 118I, NBI canceller 118 of FIG. 5A uses adaptive feedback filter 500 to search for, and when found automatically cancel the narrowband interference as it arises in the input signal on port 118I. In doing so, controller 450 in NBI canceller 118 reaches state 466 (WAIT-FOR-PROCESSOR state) as noted above.

Figure 5B:
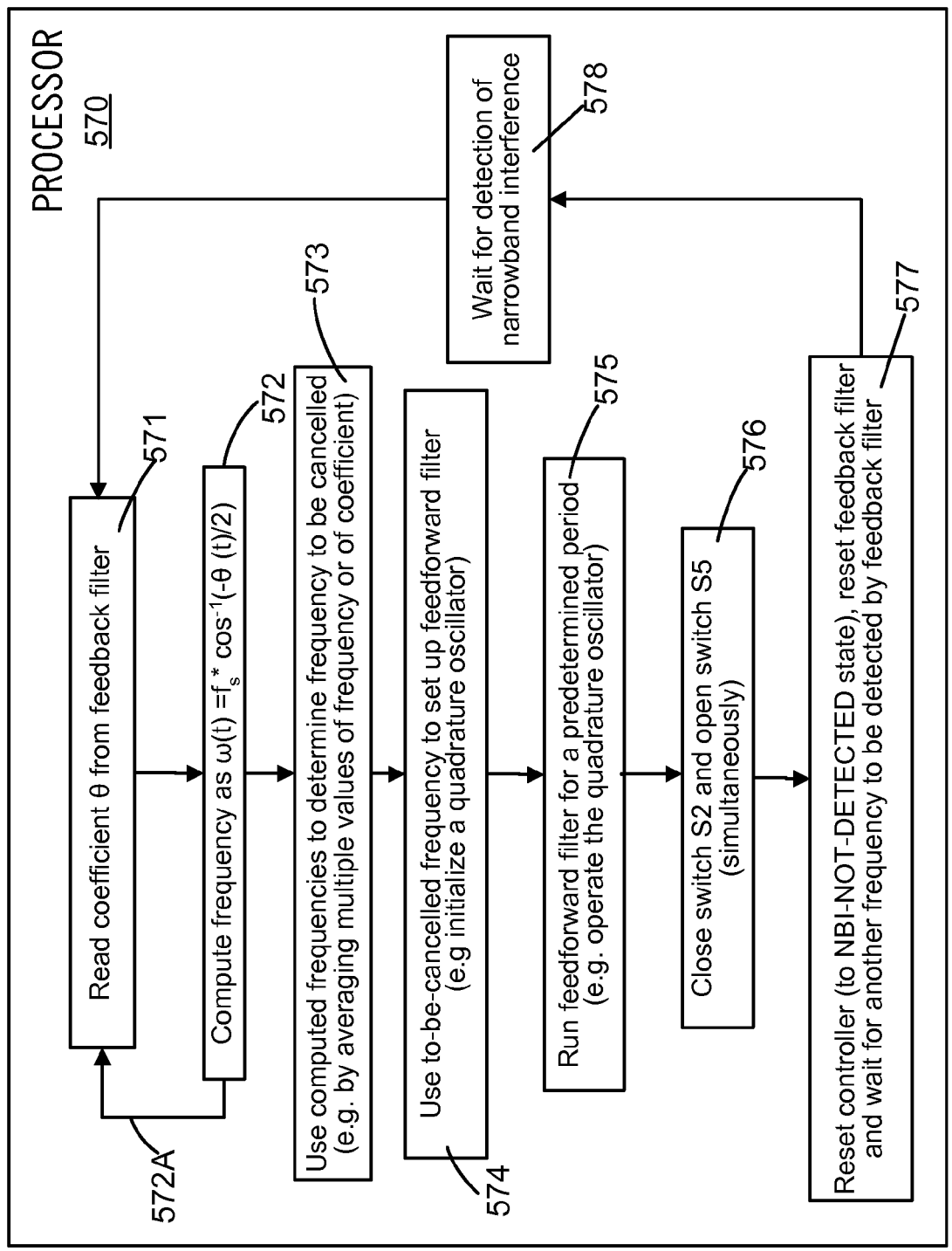
FIG. 5B illustrates, in a high level flow chart, a method performed by a processor 570 in accordance with the invention.

Thereafter, processor 570 responds by performing act 571 (FIG. 5B) in response to the interrupt (or alternatively after polling the flag), as described above in reference to state 466 (WAIT-FOR-PROCESSOR state). Specifically, in act 571, processor 570 reads a coefficient θ of a filter in adaptive narrowband interference predictor 124 that is stored in a storage element 545. Next, in act 572 processor 570 computes a frequency of the narrowband interference as follows: $\omega(t)=f_s*\cos^{-1}(-\theta/2)$ wherein $f_s$ is the sampling frequency used by A/D converter 116 (see FIG. 2A). In some embodiments, acts 571 and 572 are performed a predetermined number of times M (e.g. as illustrated by branch 572A), and in such embodiments there are M storage elements 545. Thereafter, in act 573, processor 570 determines a frequency ω that is to be cancelled, based on the M frequencies namely ω(1) ... ω(M) that were computed by multiple performance of act 572 as just described, e.g. by averaging the computed frequencies. Note that an alternative embodiment may first average the M values of the coefficient θ read from the M storage elements, and then compute an frequency based on the averaged value of θ.

Next, in act 574, processor 570 sets up a non-adaptive feedforward filter 550, by supplying the average ω determined in act 573, as the frequency to be canceled on bus 554. For example, non-adaptive feedforward filter 550 may initialize a quadrature oscillator that may be included in a non-adaptive narrowband interference predictor 551 of some embodiments. Next, in act 575 processor 570 waits for the non-adaptive feedforward filter 550 to operate for a predetermined duration (and hence in the above-described example, the quadrature oscillator is operated for the predetermined duration).

After non-adaptive feedforward filter 550 has operated for the predetermined duration, in act 576 processor 570 closes switch S2 (and opens switch S5). When switch S2 is closed, a first signal on buses 126I and 127I is an interference-canceled signal that is generated by non-adaptive feedforward filter 550 based on the average frequency ω received from processor 570. Therefore, at this stage, adaptive feedback filter 500 (FIG. 5A) is no longer used to cancel the narrowband interference of fundamental frequency ω. Hence, adaptive feedback filter 500 can now be used to identify and cancel another narrowband interference that may be arise next in the first signal (and in the input signal at input port 118I) due to another EMI source. After act 576, processor 570 resets (in act 577) controller 450 to return it to first state 461 (NBI-NOT-DETECTED state). Also, if necessary processor 570 resets (in act 577) adaptive feedback filter 500, and goes to act 578 to wait for another narrowband interference to be detected and cancelled by adaptive feedback filter 500, and then returns to act 571.

Non-adaptive feedforward filter 550 of several illustrative embodiments includes a subtractor 556 that receives the signal input at input port 118I (either directly or after delay in a first-in-first-out (FIFO) memory 602) via a bus 553 (also called "second signal"). Subtractor 556 (FIG. 6A) subtracts (as per act 621 in FIG. 6B) from the second signal on bus 553, a second predicted-interference signal on bus 555 which is generated by a non-adaptive narrowband interference predictor 551 included in filter 550. Subtractor 556 supplies the result of subtraction on bus 127I as the first signal that is input to adaptive feedback filter 500. Non-adaptive narrowband interference predictor 551 uses the second signal received on bus 559 and a decision signal received on bus 552 from adaptive feedback filter 500, to generate the second predicted-interference signal on buses 612 and 555, by use of the to-be-cancelled frequency ω received on bus 554. The second predicted-interference signal on bus 555 is supplied to subtractor 556 via switch S2 operated by processor 570 as discussed above.

In some embodiments of the invention, non-adaptive narrowband interference predictor 551 is implemented by a narrow band notch filter 1000 that uses an interference-cancelled signal that is received on bus 614 to generate (as per act 622 in FIG. 6B) the second predicted-interference signal on bus 612, e.g. by use of a quadrature oscillator as described below. The second predicted-interference signal generated by narrow band notch filter 1000 is also supplied on bus 555 (as described above). Non-adaptive narrowband interference predictor 551 also includes an arithmetic unit 611 (FIG. 6A) that is coupled to bus 612 to receive therefrom the predicted-interference signal. Arithmetic unit 611 also receives two signals namely (1) the second signal on bus 559 and (2) the decision signal on bus 552. Arithmetic unit 611 subtracts (as per act 623 in FIG. 6B) from the second signal on bus 559, two signals namely the predicted-interference signal on bus 612 and the decision signal on bus 552. In an illustrative embodiment, arithmetic unit 611 is implemented by two subtractors (not shown in FIG. 6A and not further described as they are believed to be readily apparent to a skilled artisan in view of this disclosure).

Although only one predictor 551 has been described above, in some embodiments, filter 550 includes multiple predictors, e.g. one for each frequency to be canceled. For example, in certain embodiments, three tones φ1, φ2 and φ3 are identified within a noise signal that is output by arithmetic unit 126, and filter 550 includes three predictors 551, 558 and 559 each used to cancel a corresponding one of the three tones. The three frequencies to be canceled are supplied by a processor 570.

Depending on the embodiment, narrow band notch filter 1000 includes a quadrature oscillator that may be either digital or analog, and the quadrature oscillator generates two sinusoids (sine and cosine) at a frequency that is numerically controllable. In certain illustrative embodiments of the invention, narrow band notch filter 1000 includes a digital quadrature oscillator ("DQO") as described in the U.S. patent application, with Dariush Dabiri as the first-named inventor, that is concurrently filed herewith, and co-owned as follows:

(5) "Stabilized Digital Quadrature Oscillator", Ser. No. 12/952,154. The just-described patent application is hereby incorporated by reference herein, in its entirety.

Narrow band notch filter 1000 of some embodiments includes such a stabilized DQO, which is initialized using the to-be-cancelled frequency ω received on bus 554 and thereafter during operation estimates narrowband interference in the form of EMI (Electromagnetic interference). As described in the U.S. patent application Ser. No. 12/952,154 identified in the previous paragraph, narrow band notch filter 1000 includes a stabilized quadrature oscillator 1010; multipliers 1021, 1023, 1031, 1041, 1043, and 1051; adders 1025, 1045, and 1060; delay registers 1027 and 1047; and quantizers 1029 and 1049. Specifically, the to-be-cancelled frequency ω on bus 554 (which is called an input signal IN in the U.S. patent application Ser. No. 12/952,154) is processed using a pair of quadrature signals to predict two parts of the NBI. The two parts are then combined to form the predicted-interference signal (which is called estimate signal EMI_E in the U.S. patent application Ser. No. 12/952,154 identified in the previous paragraph).

Figure 6A:
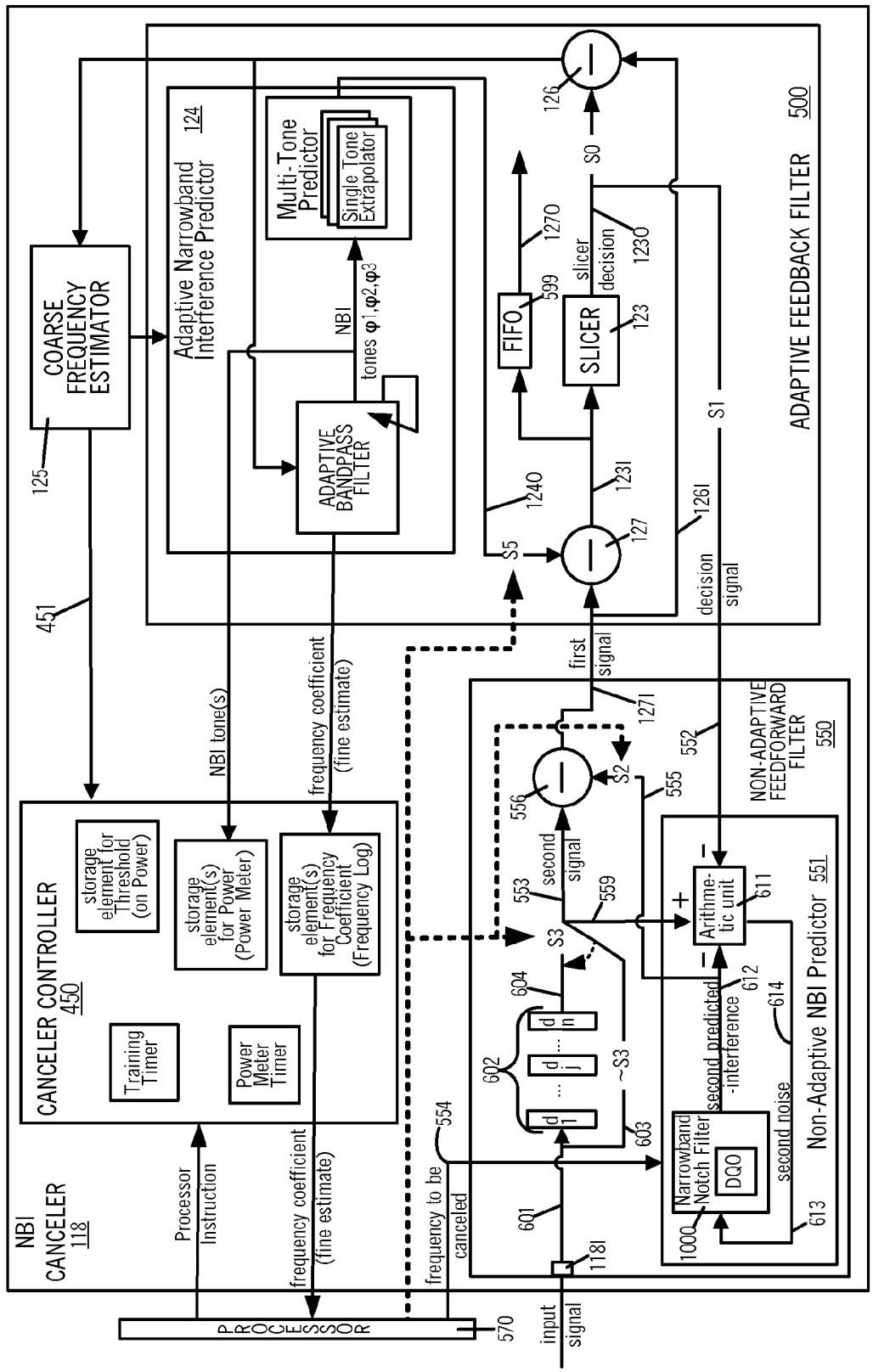
FIG. 6A illustrates, in an intermediate level block diagram, an illustrative aspect of the non-adaptive narrowband interference predictor 551 of FIG. 5A, as well as a FIFO memory 602 that is included in a non-adaptive feedforward filter 550 of some embodiments.
Figure 6B:
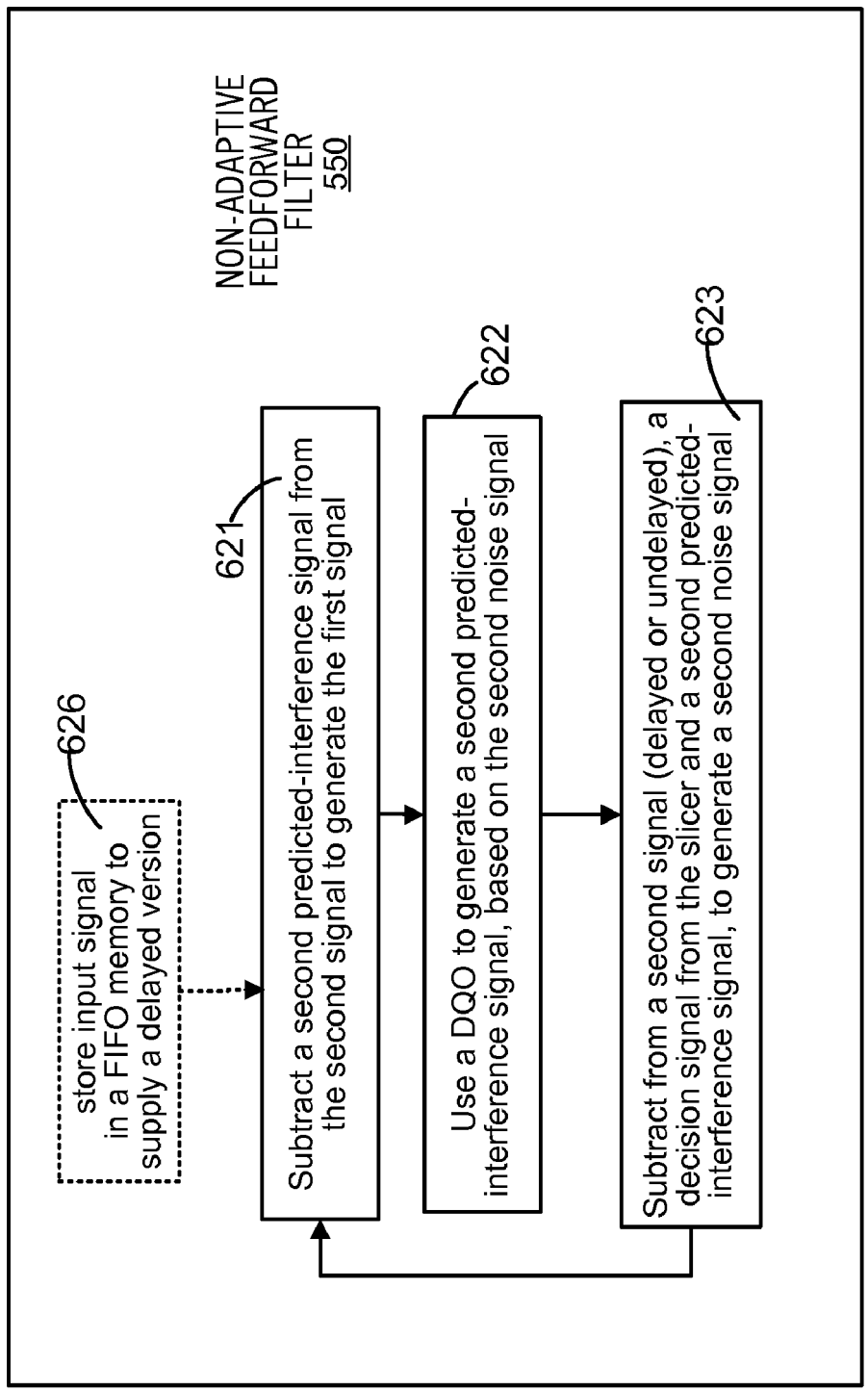
FIG. 6B illustrates, in another high level flow chart, a method performed by a narrowband interference canceller 118 in operating the adaptive feedback filter 500 and the non-adaptive feedforward filter 550 in some embodiments of the invention.

In some embodiments of the type shown in FIG. 6A, initially a switch ~S3 is closed in a path through bus 603. Hence, FIFO memory 602 is initially bypassed, the second signal on bus 553 is not delayed and the second signal is identical to the input signal received on input port 118I. Hence, in act 623 shown in FIG. 6B, an undelayed version of the second signal is subtracted. Also initially, non-adaptive feedforward filter 550 is not in use, and therefore, the first signal on bus 127I is same as the second signal, which in turn is same as the input signal received on input port 118I.

When a narrowband interference initially arises, sometimes the narrowband interference ramps up too quickly to be correctly predicted by predictor 124. When narrowband interference is not properly predicted, the NBI is not fully canceled by subtractor 127, and hence slicer 123 starts making errors in its decision signal output on bus 123O. To address a fast ramp up in narrowband interference as described in the previous paragraph, some embodiments of NBI canceller 118 use a FIFO memory 602 formed by a number of storage elements d1 . . . dj . . . dn shown in FIG. 6A, to store (as per act 626 in FIG. 6B) the input signal being received at input port 118I. Specifically, FIFO memory 602 temporarily buffers the input signal while the input signal is simultaneously being processed in real time, by filter 500 to identify the to-be-cancelled frequency ω.

To reiterate, while the frequency ω is being identified, samples of the input signal are also simultaneously stored in FIFO 602 and these samples are later available (in case useful to reduce slicer errors), on a path through bus 604, switch S3 and bus 553 as follows. Specifically, after controller 450 reaches state 466 (WAIT-FOR-PROCESSOR state), processor 570 closes switch S3 and opens switch ~S3. On doing so, non-adaptive feedforward filter 550 does not receive the samples of the input signal in real time and instead starts receiving a delayed version of the input signal now supplied on bus 553 via switch S3. Therefore, non-adaptive feedforward filter 550 uses the to-be-cancelled frequency ω to cancel the narrowband interference on the buffered samples of the input signal (which same samples were earlier used to determine frequency ω in real time).

To ensure that errors made by slicer 123 while it was operating on the input signal in real time are discarded in situations wherein the narrowband interference ramps up too quickly, one embodiment of NBI canceller 118 includes an additional FIFO memory 599 that is used initially (while adaptive feedback filter 500 operates on the input signal in real time) to buffer the output signal being supplied to the error correcting decoder. Therefore, when the narrowband interference ramps up too quickly and slicer 123 starts making errors, this additional FIFO memory 599 holds the slicer errors, and the slicer errors therein are bypassed by use of additional switches (not shown) similar to switch ~S3 being opened and S3 being closed. To recap, initially when input FIFO memory 602 is being bypassed, output FIFO memory 599 is in use and later on when a switchover is done by processor 570 (from using filter 500 to filter 550), the just-described usage of these two FIFOs is reversed.

Whether or not the above-described usage of FIFOs is required to correct for slicer error depends on how quickly NBI ramps up, which in turn depends on the type of wireless device that causes the NBI. In some data centers wherein cell phone usage is common, NBI caused by the cell phone is likely to ramp up quickly and hence an option to use the FIFOs as described above is provisioned ahead of time, in some embodiments of NBI canceller 118. In other data centers wherein the NBI is caused by use of walkie-talkies, the NBI ramps up slowly, and hence use the FIFOs as described above is not required.

Figure 7A:
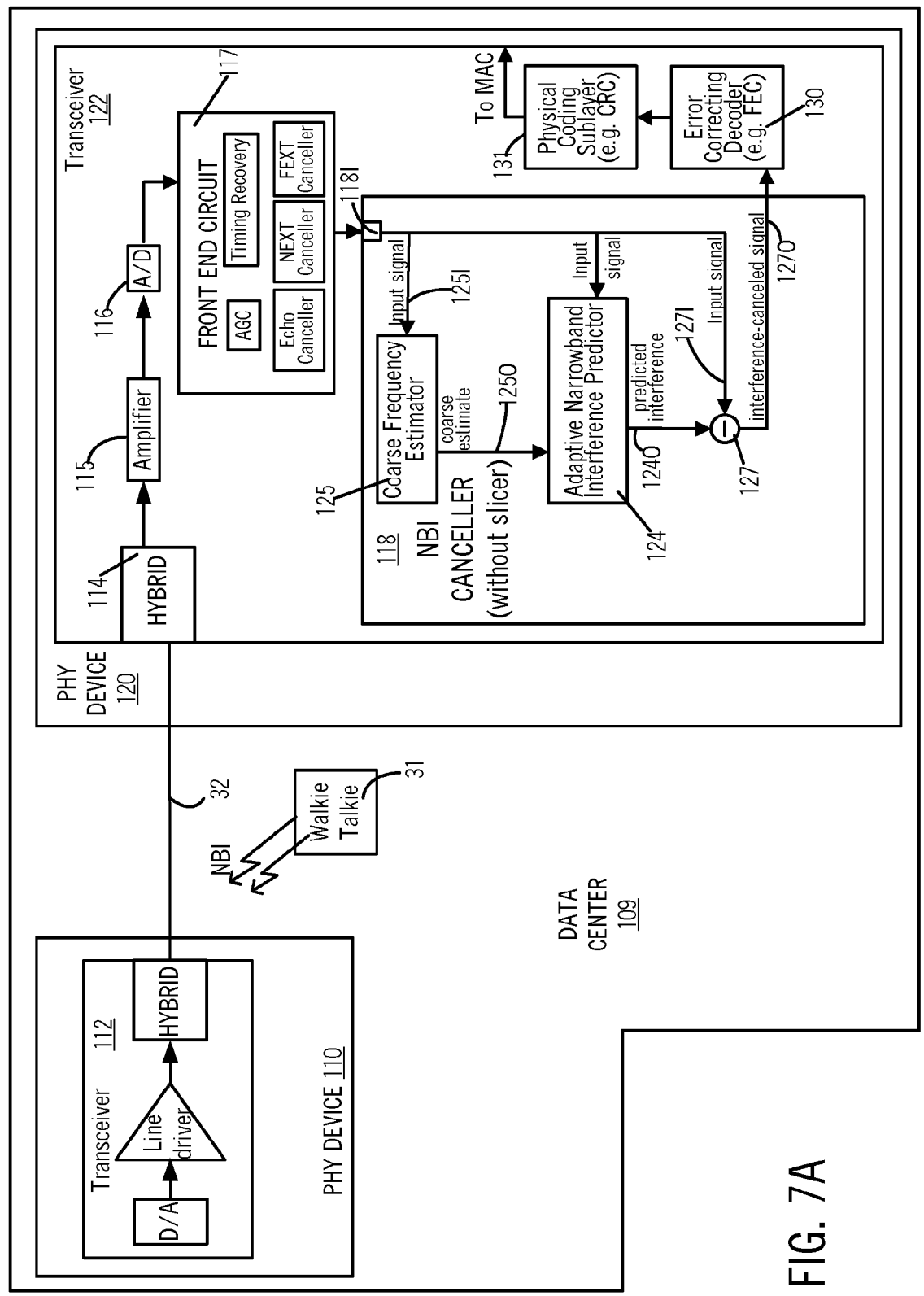
FIG. 7A illustrates, in yet another high level block diagram, a narrowband interference canceller 118 configured to use adaptive feedforward filter 500 in a feedforward mode without use of a slicer in some embodiments of the invention.
Figure 7B:
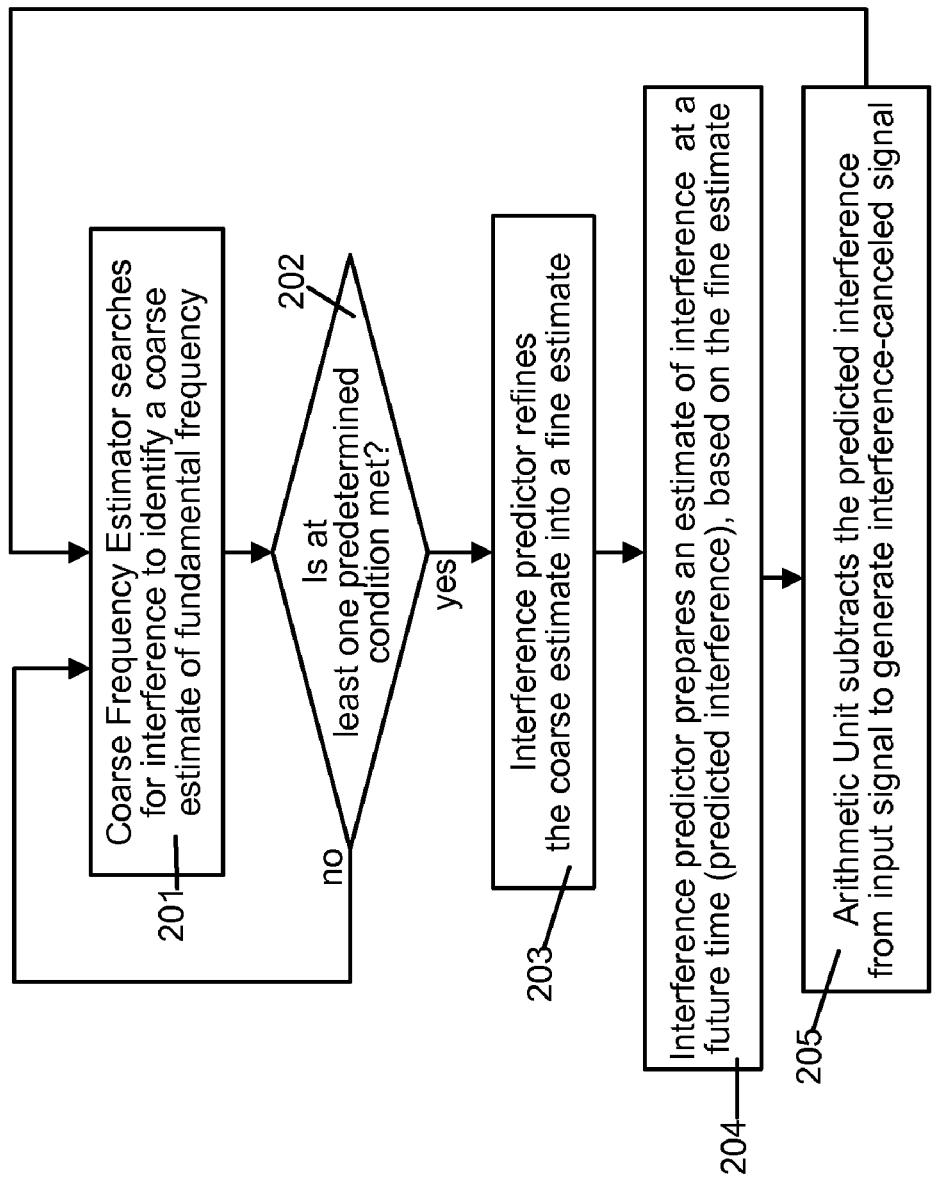
FIG. 7B illustrates, in a high level flow chart, a method performed by adaptive feedforward filter 500 in accordance with the invention.

Note that in some embodiments, processor 570 opens switches S0 and S1 (see FIG. 6A) and on doing so, NBI canceller 118 operates in a feedforward mode as illustrated in FIG. 7A. The acts performed in the feedforward mode are a subset of the above-described acts 201-205 as illustrated in FIG. 7B.

Figure 8:
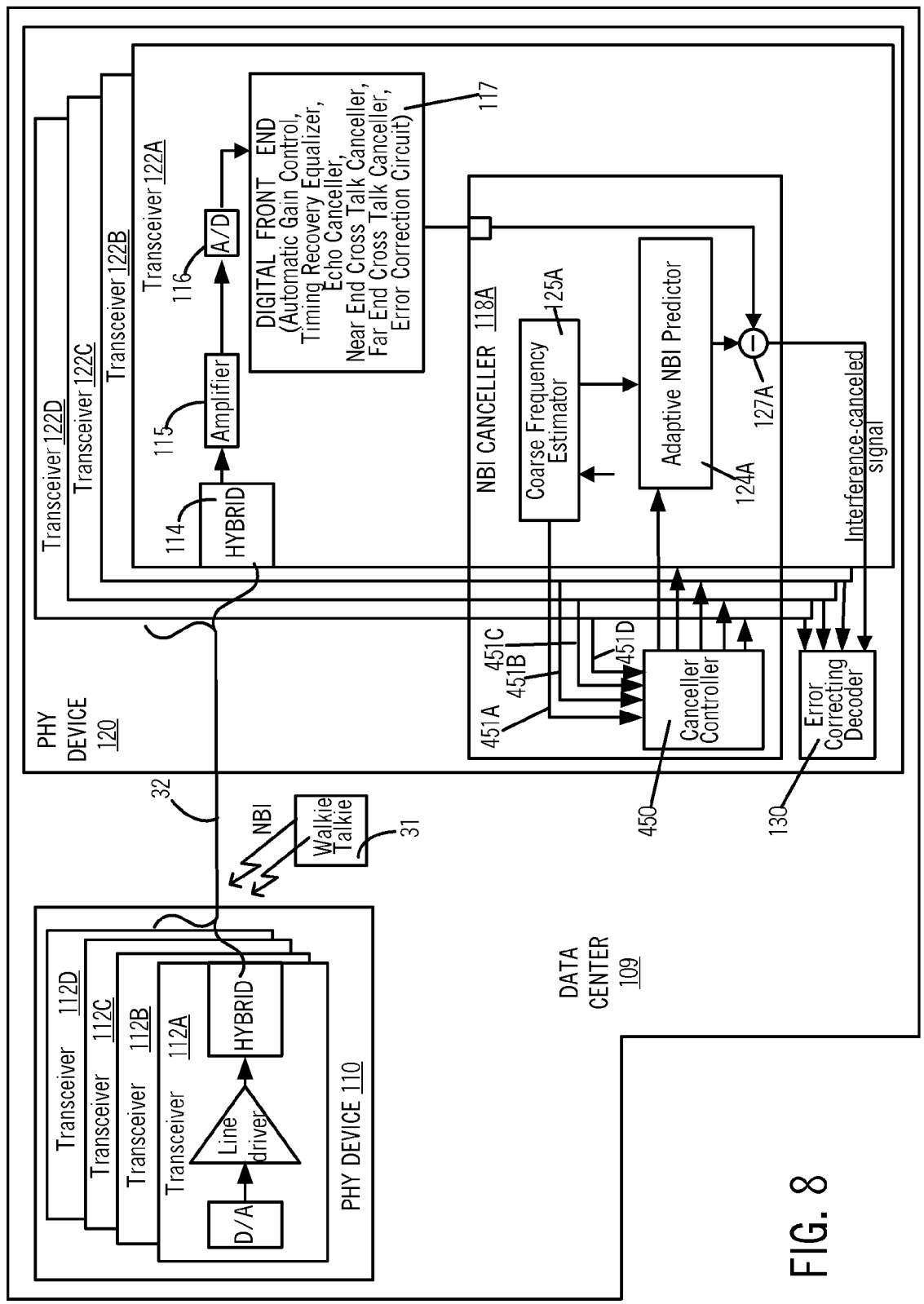
FIG. 8 illustrates, in another high level block diagram, a narrowband interference canceller 118 for multiple transceivers 122A-122D that respectively operate on multiple receive paths through cable 32, and use a common canceller controller 450 in some embodiments of the invention.

Furthermore, in some embodiments, a common canceller controller 450 is shared by multiple transceivers 122A-122D all of which are connected to conductors in a common cable 32, as illustrated in FIG. 8. In several such embodiments, common canceller controller 450 receives four signals on four lines 451A-451D from four coarse frequency estimators (although only one is shown in FIG. 8, as 125A to improve clarity of the drawing). Common canceller controller 450 of some embodiments immediately transitions to the NBI-DETECTED state 462 when any one of the four lines 451A-451D carries an active signal. In the embodiment illustrated in FIG. 8, note that a common error correcting decoder 130 receives four interference-canceled signals from four subtractors (again only one is shown in FIG. 8, as 127A to improve clarity of the drawing).

In some embodiments of the invention, various thresholds used by an NBI canceller of the type described above are provisioned ahead of time. The thresholds are determined by testing and evaluating the effectiveness of different values of the thresholds, in identifying and cancelling EMI of the type typically found in a data center. For example, effectiveness of threshold values may be tested for cancellation of EMI generated by two main classes of wireless devices, namely cell phones and wireless devices. The EMI generated by such devices may be recorded and combined with various background noises to generate signatures of the type illustrated in FIG. 2C and appropriate threshold values are selected by trial and error.

In some embodiments, adaptive spectral enhancer 301 is implemented as an "adaptive spectral enhancement circuit 199" as described in the concurrently filed U.S. patent application Ser. No. 12/952,178 entitled "Adaptive Spectral Enhancement and Harmonic Separation" incorporated by reference above. Moreover, adaptive spectral enhancer 301 may be implemented using one or more infinite impulse response (IIR) filters of the type described in U.S. patent application Ser. No. 12/952,193 entitled "Multi-Input IIR Filter with Error Feedback" incorporated by reference above.

Therefore, in several aspects of the invention, a method and circuit operate on an input signal that includes EMI noise to generate an output signal without at least a portion of the EMI noise. In one illustrative aspect of the invention, the just-described circuit includes a noise predictive narrowband interference canceller in an Ethernet receiver (e.g. in a 10GBASE-T transceiver chip, also called a PHY), in order to cancel interference due to walkie-talkies, cell phones and other wireless devices, thereby to enable Ethernet connections in a data center (e.g. using 100 m of data center cabling, such as twisted pairs) to operate in an uninterrupted manner, without link drop. In some aspects of the invention, the noise predictive narrowband interference canceller is used only initially to identify and cancel EMI noise from a first source, and after the frequency of the EMI noise is determined that frequency is used to initialize a feed forward filter which then performs the function of EMI noise cancellation thereby to free up the narrowband interference predictor for use with a second source of EMI noise.

One or more embodiments of the type described herein may be used to implement 10GBASE-T PHYs of the type described in a Preliminary Product Brief document entitled "Triveni Dual/Quad Port 10GBASE-T PHY" published July 2010 by AMCC that is incorporated by reference herein in its entirety, and available at on the Internet at the address (wherein the forward slash is replaced by "%" sign): http:%%/www.appliedmicro.com%MyAMCC%retrieveDocument%MXD%TechDocs%AP M9xxxx%APM96892_93_94_95%APM96892_93_94_95_Triveni_PB2162.pdf One or more circuits and/or methods described herein may be implemented and/or performed in various ways. For example, one or more features and/or circuit elements and/or method steps/acts described above and/or illustrated in FIGS. 2A, 2B, 3A, 3B, 4A, 4B, 5A, 5B, 6A, 6B, 7A, 7B and 8 may be implemented in hardware, firmware, software, or a combination thereof. For several implementations, one or more features and/or circuit elements and/or method steps/acts described above and/or illustrated in the just-described figures may be used and/or implemented within specific hardware, e.g. one or more application specific integrated circuits (ASICs), digital signal processors (DSPs), programmable logic devices (PLDs), field programmable gate arrays (FPGAs), processors, controllers, micro-controllers, microprocessors, electronic devices, circuits and systems designed to perform the functions described herein, or a combination thereof. For certain implementations, one or more features and/or circuit elements and/or method steps/acts described above and/or illustrated in the just-described figures may be implemented with modules (e.g., procedures, functions, and so on) that perform the functions described herein by use of software and/or firmware executing in hardware of the type just described in the previous sentence. Additionally, any non-transitory machine readable medium tangibly embodying instructions may be used in implementing one or more features and/or circuit elements and/or method steps/acts described above and/or illustrated in the above-described figures. Also, as used herein the terms "memory" and "storage element" refer to any type of long term, short term, volatile (e.g. DRAM), nonvolatile (e.g. SRAM), flip-flop, latch, or other memory that is non-transitory and accessible by any circuitry, such as a processor.

Therefore, numerous modifications and adaptations of the embodiments and aspects described herein will become apparent to the skilled artisan in view of this disclosure. Numerous modifications and adaptations of the embodiments and aspects described herein are encompassed by the scope of the invention.

What is claimed is:

1. A method to perform cancelation of narrow band interference (NBI) in a first signal, the method comprising:
    (a) slicing the first signal to generate a decision signal;
    (b) subtracting the decision signal from the first signal to obtain a noise signal;
    (c) analyzing a frequency spectrum of the noise signal, to prepare a coarse estimate of a fundamental frequency of a narrow band interference in the noise signal;
    if the coarse estimate does not satisfy at least one predetermined criterion:
        (d) repeating said (a) slicing, (b) subtracting, and (c) analyzing;
    if at least said one predetermined criterion is satisfied by the coarse estimate:
        (e) based on the coarse estimate, adaptively filtering the noise signal to refine the coarse estimate of the fundamental frequency into a fine estimate of the fundamental frequency;
        (f) preparing a predicted-interference signal at a clock cycle in future based at least partially on the fine estimate of the fundamental frequency;
        (g) at said clock cycle, subtracting the predicted-interference signal from the first signal, to generate an interference-canceled signal;
        (h) slicing the interference-canceled signal to generate the decision signal;
        (i) subtracting from the first signal, the decision signal resulting from (h) slicing, thereby to obtain the noise signal;
        (j) repeating said (e) adaptively filtering, (f) preparing, (g) subtracting, (h) slicing and (i) subtracting; and
        (k) recording the fine estimate in a computer memory at least once.

2. The method of claim 1 further comprising:
    (l) accumulating in a storage element, for a period of time indicated by a timer, power of a tone in the narrow band interference at least at the fine estimate of the fundamental frequency; and
    (m) if accumulated power in the storage element does not satisfy another predetermined criterion, repeating said (a) slicing, (b) subtracting, and (c) analyzing;
    wherein said (g) subtracting, (h) slicing, (i) subtracting, and (j) repeating are performed when the accumulated power in the storage element satisfies said another predetermined criterion.

3. The method of claim 1 further comprising:
    operating a digital quadrature oscillator (DQO) at a center frequency derived at least partially from the fine estimate recorded in act (k); and
    repeating said acts (a)-(k) for another narrow band interference.

4. The method of claim 3 wherein:
    the center frequency is derived by averaging the fine estimate recorded in act (k).

5. The method of claim 4 wherein:
    the averaging is performed over multiple values of the fine estimate recorded in act (k) during a period of time indicated by a timer.

6. The method of claim 3 further comprising:
    subtracting from a second signal, the decision signal and a second predicted-interference signal, to generate a second noise signal;
    wherein the DQO generates the second predicted-interference signal based on the second noise signal.

7. The method of claim 6 further comprising:
    subtracting the second predicted-interference signal from the second signal, to generate the first signal.

8. The method of claim 3 wherein:
    said operating of the DQO is performed after said repeating (j) is performed for a period of time indicated by a timer.

9. The method of claim 3 further comprising:
    storing an input signal in a memory;
    subtracting from a second signal output from said memory, the data signal and a second predicted-interference signal, to generate a second noise signal;
    wherein the DQO generates the second predicted-interference signal based on the second noise signal.

10. A receiver having a port to be coupled to a cable to receive therefrom an analog signal comprising narrow band interference (NBI) from a wireless device, the receiver comprising:
    an analog-to-digital converter to receive the analog signal and supply a digital signal;
    an error correcting decoder; and an NBI canceller having an input port coupled to the analog-to-digital converter to receive therefrom an input signal derived from the digital signal, the NBI canceller being coupled to the error correcting decoder to supply thereto an interference-canceled signal;

wherein the NBI canceller comprises:

a first arithmetic unit having a first input bus coupled to the input port to receive the input signal, first arithmetic unit having a second input bus to receive a predicted-interference signal, and first arithmetic unit having a first output bus to supply the interference-canceled signal;

an adaptive narrowband interference predictor coupled to the second input bus of the first arithmetic unit to supply thereto the predicted-interference signal;

a slicer coupled to the first output bus of the first arithmetic unit to receive therefrom said NBI-canceled signal, the slicer having a second output bus to supply thereto a decision signal derived from the interference-canceled signal;

a second arithmetic unit having a third input bus coupled to the slicer to receive therefrom the decision signal, the second arithmetic unit having a fourth input bus coupled to the input port to receive said input signal, second arithmetic unit having a third output bus to supply a noise signal;

wherein the noise signal comprises a difference between the input signal and the decision signal; and a coarse frequency estimator coupled to the third output bus to receive therefrom the noise signal, the coarse frequency estimator having a fourth output bus coupled to the adaptive narrowband interference predictor to supply thereto a coarse estimate of a fundamental frequency of the NBI in the noise signal.

11. The receiver of claim 10 wherein the predicted-interference signal is extrapolated to occur in the input signal after a predetermined duration representing a delay in a path through at least the slicer and the coarse frequency estimator.

12. The receiver of claim 10 wherein the error correcting decoder comprises a low density parity checking (LDPC) circuit.

13. A receiver to perform cancelation of narrow band interference (NBI) in a first signal, the receiver comprising:

means for subtracting a decision signal from the first signal to obtain a noise signal;

means for analyzing a frequency spectrum of a noise signal, to prepare a coarse estimate of a fundamental frequency of a narrow band interference in the noise signal;

means for checking whether the coarse estimate satisfies at least one predetermined criterion;

means, responsive to a finding that said predetermined criterion is not satisfied by said means for checking, for repeatedly invoking said means for subtracting, and said means for analyzing;

means, responsive to a finding that said predetermined criterion is satisfied by said means for checking, for adaptively filtering the noise signal to refine the coarse estimate of the fundamental frequency into a fine estimate of the fundamental frequency;

means for preparing a predicted-interference signal at a clock cycle in future based at least partially on the fine estimate of the fundamental frequency;

means for subtracting the predicted-interference signal from the first signal, to generate an interference-canceled signal;

means for subtracting from the first signal, the decision signal, to obtain the noise signal; and means for recording the fine estimate in a computer memory at least once.

14. The receiver of claim 13 further comprising:

means for accumulating in a storage element, for a period of time indicated by a timer, power of a tone in the narrow band interference at least at the fine estimate of the fundamental frequency.

15. The receiver of claim 13 further comprising:

means for operating a digital quadrature oscillator (DQO) at a center frequency derived at least partially from the fine estimate.

16. The receiver of claim 15 further comprising:

means for averaging the fine estimate;

wherein the means for averaging is coupled to the means for operating, to supply thereto the center frequency.

* * * * *